United States Patent [19]

Yagi et al.

[11] Patent Number: 4,881,319
[45] Date of Patent: Nov. 21, 1989

[54] PROCESS FOR MOUNTING CHIP TYPE CIRCUIT ELEMENTS ON PRINTED CIRCUIT BOARDS AND APPARATUS THEREFOR

[75] Inventors: Hiroshi Yagi; Hisashi Fujita; Yoshio Harada; Kenichi Takahashi, all of Tokyo, Japan

[73] Assignee: TDK Corporation, Japan

[21] Appl. No.: 67,648

[22] Filed: Jun. 26, 1987

Related U.S. Application Data

[63] Continuation of Ser. No. 775,732, Sep. 13, 1985, abandoned.

[30] Foreign Application Priority Data

| Sep. 17, 1984 | [JP] | Japan | 59-192679 |
| May 20, 1985 | [JP] | Japan | 60-106056 |
| Jun. 10, 1985 | [JP] | Japan | 60-86380 |
| Jun. 17, 1985 | [JP] | Japan | 60-90162 |
| Jul. 26, 1985 | [JP] | Japan | 60-113797 |

[51] Int. Cl.$^4$ .......................... H05K 3/34; B23P 19/00
[52] U.S. Cl. ...................................... 29/840; 29/740; 228/6.2; 414/744.2
[58] Field of Search .................... 29/740, 752, 840; 228/6.2; 414/744.2

[56] References Cited

U.S. PATENT DOCUMENTS

| 3,337,941 | 8/1967 | Drop | 29/740 X |
| 3,499,204 | 3/1970 | Drop | 29/740 X |
| 4,290,732 | 9/1981 | Taki et al. | 29/740 X |
| 4,346,514 | 8/1982 | Makizawa et al. | 29/740 |
| 4,381,601 | 5/1983 | Tamai et al. | 29/740 |
| 4,437,232 | 3/1984 | Araki et al. | 29/740 |
| 4,473,247 | 9/1984 | Itemadani et al. | 29/740 X |
| 4,480,780 | 11/1984 | Claeskens et al. | 29/834 X |
| 4,494,902 | 1/1985 | Kuppens et al. | 29/740 X |
| 4,515,507 | 5/1985 | Asai et al. | 29/740 X |
| 4,527,327 | 7/1985 | Van Deuren | 29/740 |
| 4,683,654 | 8/1987 | Scholten et al. | 29/832 |

Primary Examiner—Howard N. Goldberg
Assistant Examiner—Carl J. Arbes
Attorney, Agent, or Firm—Steinberg & Raskin

[57] ABSTRACT

A process for mounting chip type circuit elements on printed circuit boards and apparatus therefor are capable of eliminating the necessity for arranging an X-Y table, thereby to simplify the structure of the apparatus, and decreasing the time required to mount one circuit element on a printed circuit board. Chip type circuit elements are sucked up by a plurality of suction pins arranged in each mounting head, transferred to a centering and turning section and then progressively mounted on a printed circuit board. The mounting head is adapted to carry out the reciprocating movement in the X-direction a plurality of times while it carries out the reciprocating movement in the Y-direction one time.

5 Claims, 20 Drawing Sheets

FIG.12
FIG.13
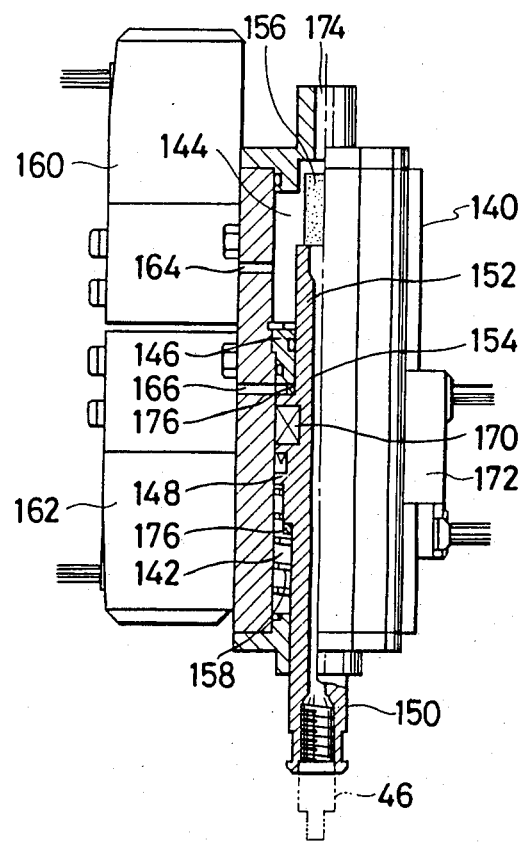
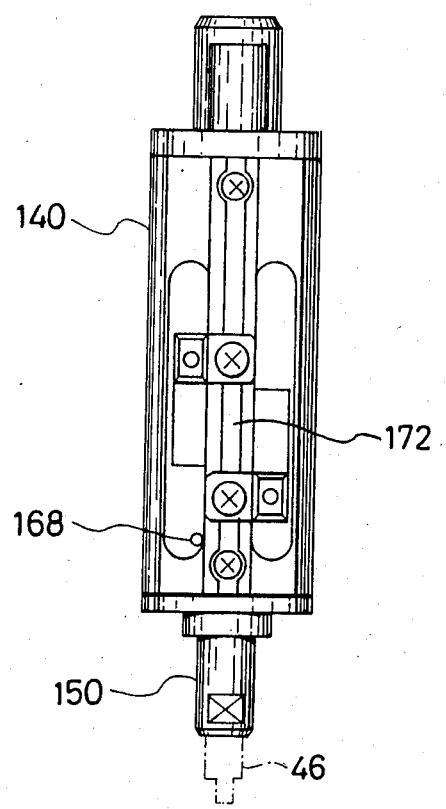

FIG.14
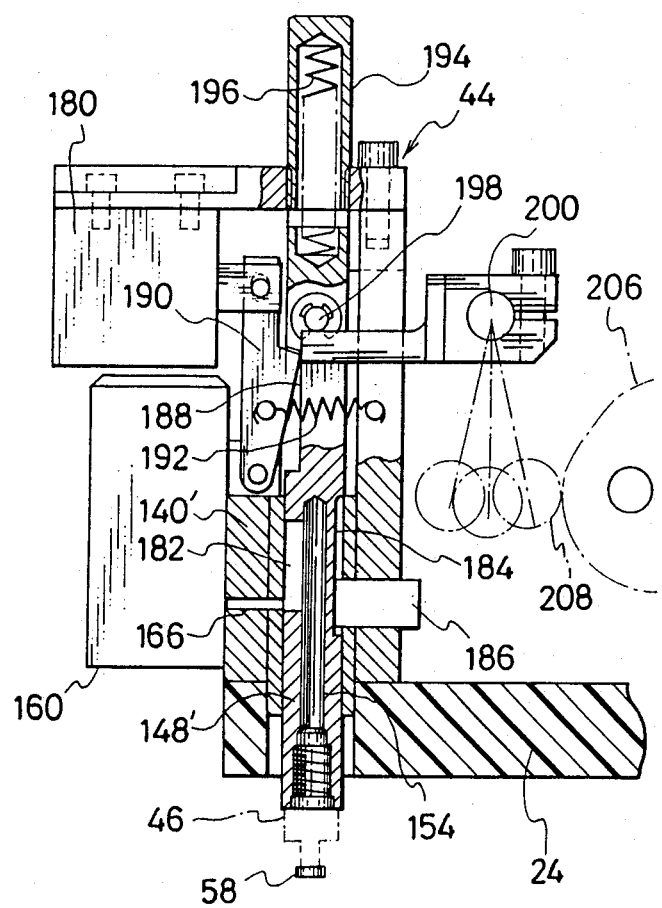

PROCESS FOR MOUNTING CHIP TYPE CIRCUIT ELEMENTS ON PRINTED CIRCUIT BOARDS AND APPARATUS THEREFOR

This is a continuation of application Ser. No. 775,732, filed 9/13/85, now abandoned.

BACKGROUND OF THE INVENTION

1. Field of the Invention

This invention relates generally to a process for mounting chip type circuit elements on printed circuit boards and an apparatus therefor. More particularly, the invention relates to such a process and an apparatus which are adapted to organize a production line of high efficiency.

2. Description of the Prior Art

Conventionally, the mounting of chip type circuit elements on printed circuit boards in an organized production line is generally carried out in a manner such that a mounting head which is adapted to hold at least one chip type circuit element thereon by suction is fixed at a position at which a chip type circuit element is to be mounted on a printed circuit board (hereinafter referred to as "circuit element mounting position" or "mounting position") or in a manner such that a mounting head is provided so as to be movable in X-Y directions by NC control or the like to extract chip type circuit elements one by one and be transferred to the circuit element mounting position for the mounting.

However, the former procedure has disadvantages that a production line organized is very long and it is extremely difficult to replace a mounting head. The latter procedure is typically taught in U.S. Pat. No. 4,372,802, issued to Harigane et al, on Feb. 8, 1983. As seen from the aforementioned U.S. patent, it also has a disadvantage that it fails to shorten the time required to mount one chip type circuit element on a printed circuit board. Also, it has another disadvantage of rendering the manufacturing cost of a circuit element mounting apparatus high.

There is another conventional mounting procedure which has been practiced for the organization of a production line. It is adapted to use a circuit element mounting apparatus which is constructed in a manner such that a plurality of magazines having chip type circuit elements different in type from one another received therein, respectively, are arranged so as to positionally correspond to the respective circuit element mounting positions of a printed circuit board, so that a plurality of the circuit element different from one another are simultaneously mounted on the printed circuit board by means of a plurality of vacuum suction pads. The conventional apparatus of such construction effectively shortens the time required to carry out the mounting. However, it has the disadvantage of rendering the lot-to-lot replacement of chip type circuit elements highly troublesome. Also, it has another disadvantage that the use of the magazines causes the apparatus to be considerably complicated in structure.

A further conventional circuit element mounting procedure has been proposed which comprises the steps of progressively feeding chip type circuit elements from a plurality of circuit element feeders according to a predetermined mounting order and mounting the circuit elements one by one on a printed circuit board by means of a mounting head while moving the printed circuit board by means of an X-Y table. Unfortunately, such a conventional procedure is no suitable for use for the organization of a production line, because mounting apparatus used therefor is very large in size and must include the X-Y table.

A chip type circuit element mounting head used in a conventional mounting apparatus is constructed in a manner such that the vertical movement of a suction pin is carried out by means of air cylinders and the sucking-up of a chip type circuit element by the suction pin is carried out utilizing a vacuum suction tube which communicates with the suction pin separately from the air cylinder, and to which an air filter and a vacuum valve are connected. The air filter acts to prevent foreign matter from entering the vacuum valve, thereby preventing damage of the valve by such matter. The vacuum valve acts to close and open a vacuum suction passage communicating with the suction pin to permit the suction pin to carry out the sucking-up and releasing of a chip type circuit element. However, the mounting head of such construction has the disadvantage of causing a circuit element mounting apparatus in which the mounting head is to be incorporated to be highly complicated in structure, to thereby be expensive and large-sized.

A mounting head used in conventional mounting apparatus is divided into two types. One is the single suction pin type, or the type having a single suction pin vertically moved by an air cylinder, and the other is the multiple suction pin type, or the type having a plurality of suction pins vertically moved by air cylinders provided corresponding to the suction pins. In each type of mounting head, much time is required to supply air to the air cylinder to permit a piston on which the suction pin is carried to be vertically moved against static friction in the cylinder. Also, the piston once move is actuated with a relatively high speed because dynamic friction is smaller than static friction, and the high speed actuation is continued right before the stop of the piston. Such characteristics tend to obstruct the sucking-up of a chip type circuit element by means of the suction pin or the mounting of a sucked-up circuit element on a substrate or printed circuit board. More particularly, in order that the suction pin be vertically moved to suck up a chip type circuit element and mount the sucked-up circuit element on a substrate or printed circuit board without applying large acceleration to the circuit element, it is desired that the movement be carried out to start at a relatively low speed, reach maximum speed at the intermediate and greatly decrease in speed just prior to termination. However, the air cylinder used in the conventional mounting head is not constructed to accomplish such movement of the suction pin. Accordingly, in the conventional mounting head, the operating speed of the air cylinder is set sufficiently low to permit the sucking-up and holding of a chip type circuit element by means of the suction pin to be positively carried out, resulting in the operating efficiency being substantially deteriorated.

Furthermore, a conventional detection mechanism for detecting the sucking-up of a chip type circuit element by means of a suction pin in each mounting head of single suction pin type is adapted to detect the suction vacuum pressure of the suction pin. However, the conventional detection mechanism has the disadvantage of lacking reliability in the operation, because the vacuum suction pressure is unstable due to air leakage between the suction pin and a sucked-up circuit element. Also, the conventional detection mechanism fails to detect the position or posture of a sucked-up circuit element. More particularly, the conventional detection mechanism fails to distinguish a correct posture, as shown in FIG. 1A, in which a chip type circuit element 58 is sucked-up by a suction pin 46, from a wrong posture of said sucked-up chip type circuit element, as shown in FIGS. 1B to 1D.

Also, in the detection mechanism for a mounting head of the single suction pin type, the stationary arrangement of a plurality of photosensors is required to carry out the effective detection of the presence and posture of a chip type circuit element. In the detection mechanism of such construction, the photosensors are coplanarly arranged at specific positions on the side of a frame base, rather than the side of a mounting head, in a manner whereby they may be angularly shifted from one another, so that the difference in level between light beams emitted from the photosensors may be provided to detect the presence and posture of a chip type circuit element. However, such a conventional detection mechanism having a disadvantage of requiring two or more photosensors and a large space for arranging the photosensors.

In a detection mechanism for a mounting head of the multiple suction pin type, a vacuum sensor is provided with every suction pin. The detection mechanism lacks reliability in the operation and fails to detect the wrong posture of a sucked-up chip type circuit element. In view of such disadvantages, a detection mechanism using photosensors has been proposed. However, in the proposed detection mechanism, it is substantially impossible to ensure a space in which a plurality of the photosensors are to be arranged.

SUMMARY OF THE INVENTION

The present invention has been made in view of the foregoing disadvantages of the prior art.

The principal object of the invention is to provide a process for mounting chip type circuit elements on printed circuit boards, which process is capable of significantly shortening the time required to mount one chip type circuit element on a printed circuit board and capable of organizing a production line of high efficiency.

An object of the present invention is to provide a process for mounting chip type circuit elements on printed circuit boards, which process is capable of eliminating the necessity for arranging an X-Y table, thereby to substantially simplify the structure of a mounting apparatus to be used for practicing the process.

Another object of the invention is to provide a process for mounting chip type circuit elements on printed circuit boards, which process is capable of readily varying the circuit element mounting position according to a predetermined program within a range at which a suction pin covers a printed circuit board.

Still another object of the invention is to provide a process for mounting chip type circuit elements on printed circuit boards, which process is capable of progressively moving printed circuit boards in a predetermined transfer passage and capable of organizing a production line of high efficiency.

Yet another object of the invention is to provide apparatus for mounting chip type circuit elements on printed circuit boards, which apparatus is capable of significantly shortening the time required to mount one chip type circuit element on a printed board and capable of organizing a production line of high efficiency.

An object of the invention is to provide apparatus for mounting chip type circuit elements on printed circuit boards, which apparatus is capable of eliminating the necessity for arranging an X-Y table, thereby substantially simplifying the structure.

Another object of the invention is to provide apparatus for mounting chip type circuit elements on printed circuit boards, which apparatus is capable of readily varying the circuit element mounting position according to a predetermined program within a range at which a suction pin covers a printed circuit board.

Still another object of the invention is to provide apparatus for mounting chip type circuit elements on printed circuit boards, which apparatus is capable of progressively moving printed circuit boards in a predetermined transfer passage and organizing a production line of high efficiency.

Yet another object of the invention is to provide apparatus for mounting chip type circuit elements on printed circuit boards, which apparatus includes a circuit element mounting head highly simplified in structure.

An object of the invention is to provide a chip type circuit element mounting head for circuit element mounting apparatus, which head is capable of significantly simplifying the structure of the mounting apparatus.

Another object of the invention is to provide apparatus for mounting chip type circuit elements on printed circuit boards, which apparatus is capable of carrying out the mounting operation in a manner which minimizes acceleration applied to a chip type circuit element and at a high speed.

Still another object of the invention is to provide a chip type circuit element mounting head for circuit element mounting apparatus, which head is adapted to actuate a suction pin by means of a vertically moving rod substituted for an air cylinder to carry out the circuit element mounting operation with ideal mounting speed characteristics, which permit acceleration applied to a circuit element to be minimized and the overall mounting speed to be greatly increased.

Yet another object of the invention is to provide apparatus for mounting chip type circuit elements on printed circuit boards, which apparatus is capable of effectively detecting the presence and posture of a chip type circuit element sucked-up on a suction pin.

Another object of the invention is to provide a sucked-up chip type circuit element detection mechanism for circuit element mounting apparatus, which mechanism is capable of effectively accomplishing the detection of the presence and posture of a circuit element by means of a single photosensor per suction pin.

In accordance with the invention, a process for mounting chip type circuit elements on printed circuit boards comprises the steps of extracting chip type circuit elements from a circuit element feed section by means of a plurality of suction pins incorporated in a mounting head arranged on an X-Y table head, transferring the chip type circuit elements held on the suction pins from the feed section to a centering and turning section to carry out the centering of the chip type circuit elements and, as desired, the turning thereof, and progressively carrying out the mounting of the chip type circuit elements on a plurality of predetermined circuit element mounting positions on each of the printed circuit boards.

In a preferred embodiment of the invention, the mounting head is adapted to carry out reciprocating movement a plurality of times in the X-direction, while it carries out reciprocating movement one time in the Y-direction.

In a preferred embodiment of the invention, a plurality of the suction pins are arranged in the X-direction, and the travel of the mounting head in the X-direction is determined to be smaller than the sum of the overall length of arrangement of the suction pins and the length of the printed circuit board in the X-direction.

In accordance with the invention, apparatus for mounting chip type circuit elements on printed circuit boards comprises a mounting head arranged on an X-Y table, a plurality of suction pins provided so as to be vertically movable with respect to the mounting head, a feed mechanism for exposing the chip type circuit elements carried on each of chip tapes at a circuit element shifting position, a printed circuit board support mechanism for supporting thereon printed circuit boards on which the circuit elements are to be mounted, and a plurality of centering and turning mechanisms provide corresponding to the suction pins and arranged between the feed mechanism and the printed circuit board support mechanism.

In a preferred embodiment of the invention, the feed mechanism is arranged in number corresponding to a plurality of the suction pins, and the suction pins suck up the chip type elements from the feed mechanisms.

Also, in accordance with the invention, apparatus for mounting chip type circuit elements on printed circuit boards comprises at least one mounting head of the single suction pin type having a vertically movable suction pin, a feed mechanism for exposing chip type circuit elements carried on at least one chip tape circuit element shifting position, a printed circuit board support mechanism for supporting thereon printed circuit boards on which the chip type circuit elements are to be mounted, and a centering and turning mechanism provided corresponding to the mounting head and arranged between the feed mechanism and the printed circuit board support mechanism.

In a preferred embodiment of the invention, the chip type circuit element mounting apparatus further comprises a detection mechanism for detecting a chip type circuit element sucked up on the suction pin.

In a preferred embodiment of the invention, the detection mechanism comprises a movable support member vertically movable with respect to the mounting head having the suction pin arranged so as to be vertically movable, and a photosensor having a light detecting section arranged at the movable support member, whereby the sucking-up of the chip type circuit element on the suction pin is detected at the raising position of the movable support member and the wrong posture of the chip type circuit element sucked up on the suction pin is detected at the lowering position of the movable support member.

In a preferred embodiment of the invention, the light detecting section of the photosensor comprises a light emitting portion and a light receiving portion arranged on the side of the tip end of the suction pin, so as to be opposite each other.

Also, in accordance with the invention, a mounting head for apparatus for mounting chip type circuit elements on printed circuit boards comprises a suction pin for sucking up the chip type circuit element thereon, an air cylinder case separated into a cylinder chamber and a vacuum chamber by means of a partition member, a piston slidable with respect to said cylinder chamber, the piston comprising a lower rod portion projecting from the lower end of the case and an upper rod portion projecting through the partition member into the vacuum chamber, a vacuum suction passage defined in the piston to extend from the distal end of the lower rod portion to which the suction pin is attached to the upper end of the upper rod portion, and an air filter arranged at the upper end of the upper rod portion so as to close the upper end of the vacuum suction passage.

In accordance with the invention, a mounting head for apparatus for mounting chip type circuit elements on printed circuit board comprises a suction pin for sucking up the chip type circuit element thereon, a vertical rod arranged to be vertically movable, a vacuum suction passage defined in the vertical rod so as to communicate with the suction pin, a support member for slidably supporting the vertical rod therein, a follower member engaged with the vertical rod and actuated by a cam mechanism, and a spring for forcing the vertical rod downward.

Furthermore, in according with the invention, a chip type circuit element detection mechanism for apparatus for mounting chip type circuit elements on printed circuit boards, comprises a movable support member vertically movable with respect to a mounting head and having a vertically movable suction pin, and a photosensor having a light detecting section arranged at the movable support member, whereby the sucking-up of the chip type circuit element on the suction pin is detected at the raising position of the movable support member and the wrong posture of the chip type circuit element sucked up on the suction pin is detected at the lowering position of the movable support member.

In a preferred embodiment of the invention, the light detecting section of the photosensor comprises a light emitting portion and a light receiving portion arranged at the side of the tip end of the suction pin so as to be opposite each other.

BRIEF DESCRIPTION OF THE DRAWINGS

These and other objects and many of the attendant advantages of the present invention will be readily appreciated as the same becomes better understood by reference to the following detailed description, when considered in connection with the accompanying drawings, in which like reference numerals designate like or corresponding parts throughout and wherein:

FIG. 12 is a side elevation view, partly in section, of a modification of a chip type circuit element mounting head adapted to be used in the circuit element mounting apparatus of the invention;

FIG. 13 is a rear view of the mounting head shown in FIG. 12;

FIG. 14 is a side elevation view, partly in section, of another modification of a chip type circuit element mounting head;

DETAILED DESCRIPTION OF PREFERRED EMBODIMENTS

A process for mounting chip type circuit elements on printed circuit boards and apparatus therefor, according to the invention, will be described hereinafter with reference to the accompanying drawings.

Figure 1A:
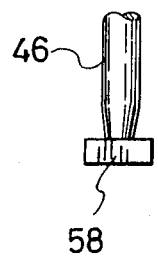
FIGS. 1A, 1B, 1C and 1D are schematic views showing the posture of a chip type circuit element sucked up on a suction pin, FIG. 1A showing the correct posture of a chip type circuit element, and FIGS. 1B to 1D showing incorrect postures thereof.
Figure 1B:
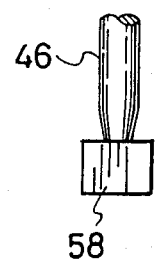
Figure 1C:
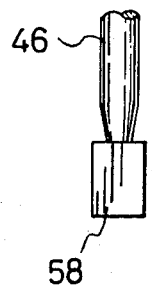
Figure 1D:
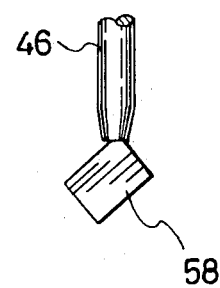
Figure 2:
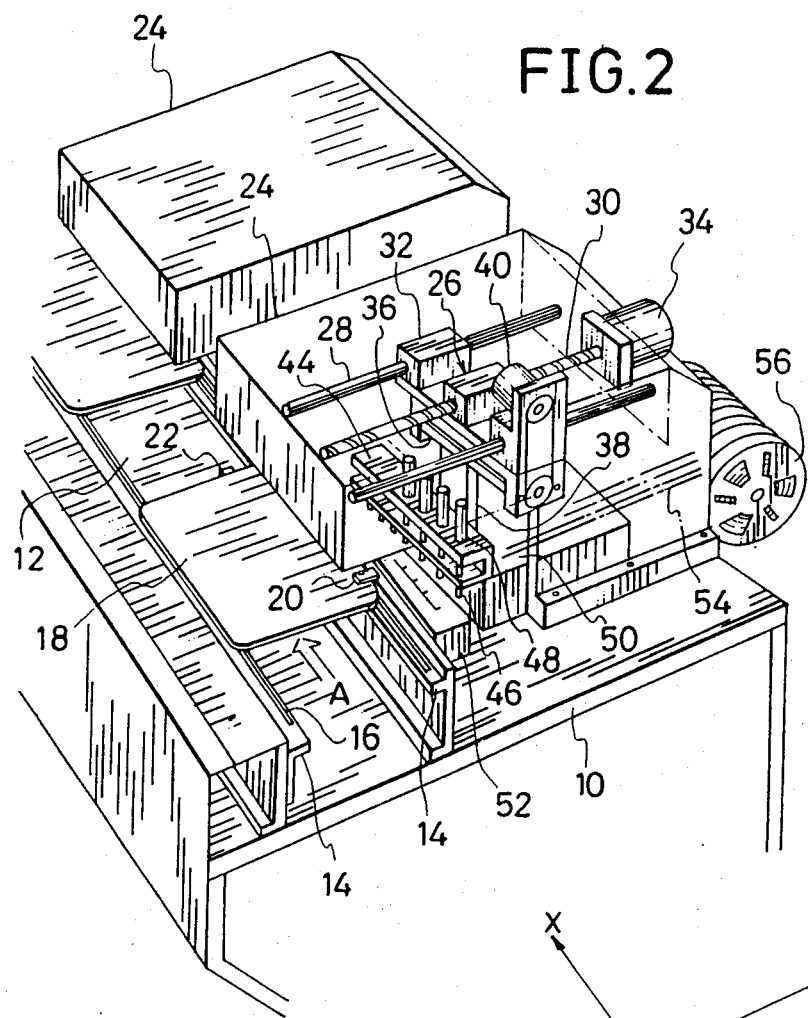
FIG. 2 is a perspective view showing an example of apparatus suitable for practicing the process of the invention for mounting chip type circuit elements on printed circuit boards.
Figure 3:
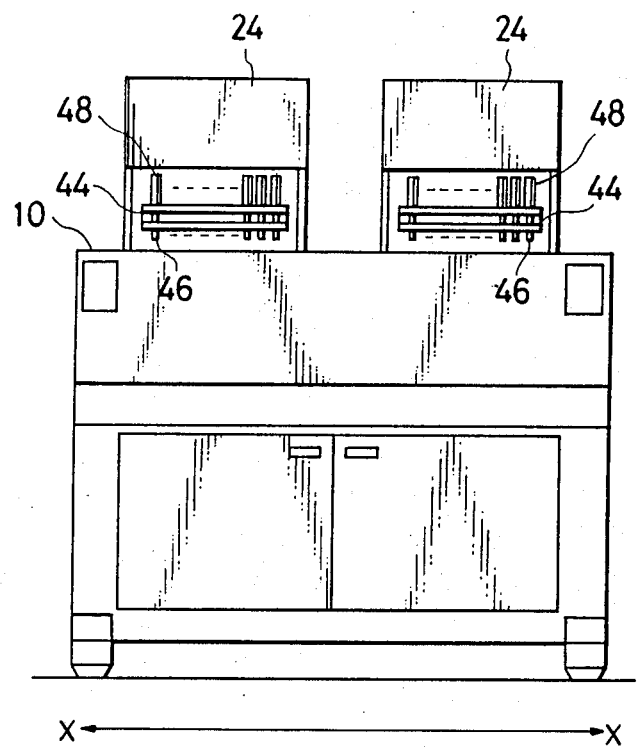
FIG. 3 is a front elevation view of the apparatus of FIG. 2.
Figure 4:
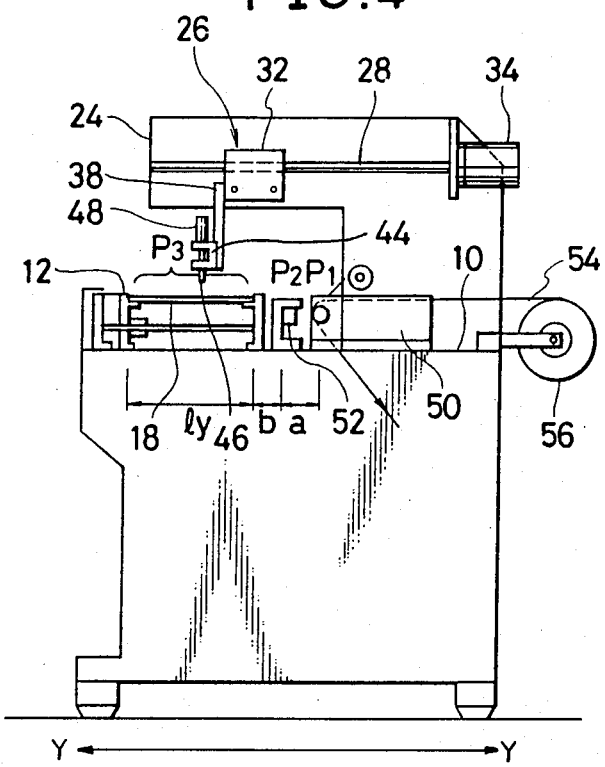
FIG. 4 is a side elevation view of the apparatus of FIG. 2.

FIGS. 2 to 4 illustrate one example of apparatus constituting one block of a production line for practicing a process for mounting chip type circuit elements on printed circuit boards, according to the present invention.

The apparatus illustrated in FIGS. 2 to 4 includes a frame base 10, which has a printed circuit board transport means 12 arranged on the forward portion thereof. The transport means includes a pair of slide rails 14, a conveyor belt 16 for moving in the direction indicated by an arrow A, printed circuit boards 18 slidably transported on the slide rails 14, a member 20 for positioning a printed circuit board 18 at a predetermined position at the time of mounting a chip type circuit element on the board 18, and a stop 22 for stopping the printed circuit board 18 at the predetermined position.

The illustrated circuit element mounting apparatus also includes a support frame 24 arranged above the printed circuit board transport means 12 so as to cover it. An X-Y table head 26 is provided in the support frame 24. The X-Y table head 26 comprises a Y-direction slide shaft 28, a Y-direction screw shaft 30, a Y-direction slider 32 supported on the Y-direction slide shaft 28, so as to be slidable in the Y-direction, and threadedly engaged with the Y-direction screw shaft 30 to be driven by a Y-direction motor, an X-direction slide shaft 36, an X-direction screw shaft (not shown), and an X-direction slider 38 supported on the X-direction slide shaft 36, so as to be slidable in the X-direction, and threadedly engaged with the X-direction screw shaft to be driven in the X-direction by an X-direction motor 40.

The illustrated mounting apparatus further includes a mounting head 44 of the multiple suction pin type fixedly arranged on the lower end of the X-direction slider 38. In the illustrated embodiment, the mounting head 44 includes ten suction pins arranged at equal intervals in the X-direction. To each of the suction pins 46 is attached an air cylinder 48 which serves to vertically move the suction pin 46. The apparatus further includes feed means 50 arranged on the frame base 10 to feed chip type circuit elements to the mounting head 44 and centering and turning means 52 arranged between the feed means 50 and the transport means 12. The centering and turning means 52 includes sections provided corresponding to the ten suction pins 46, the sections being adapted to carry out the centering and turning operation in a manner independent from one another.

Chip tapes 54 are introduced to the feed means 50. Each of the chip tapes 54 has chip type circuit elements carried thereon from a chip tape reel mechanism 56 supported at the rear portion of the frame base 10. The chip tapes 54 hold chip type circuit elements thereon corresponding to the ten suction pins 46, respectively. The illustrated embodiment is constructed in a manner such that the circuit elements on the chip tapes 54 supplied from the chip tape reel mechanism 56 can be directly sucked up by means of the suction pins 46 at a circuit element transfer or shift position determined at the forward end of the feed means 50 which is indicated at $P_1$ in FIG. 4.

The manner of practicing the process of the invention is described hereinafter with reference to FIGS. 2 to 7.

First, the mounting head 44 is moved to the transfer or shift position $P_1$ at the forward end of the feed means 50, then the air cylinders 48 are actuated to move the suction pins 46 downward, so that said suction pins may remove or attract chip type circuit elements from the chip tapes 54 by vacuum suction, and then said suction pins are moved upward by said air cylinders. Thereafter, the mounting head 44 is horizontally moved, as shown in FIG. 4, by a distance a to a position $P_2$ above the centering and turning means 52, where the air cylinders 48 are actuated to lower the suction pins 46. At this time, the suction pins 46 are released from the vacuum suction of the air cylinders 48 to transfer the chip type circuit elements to the centering and turning means 52 to carry out the operation of centering a chip type circuit element and, if desired, the operation of turning the circuit element, for example, every angle of 90 or 45 degrees. After the centering and turning operations, the suction pins 46 each attract the chip type circuit element by vacuum suction and move it a distance b. Then, the mounting head 44 is moved in the X- and Y-directions to allow the suction pins 46 to progressively carry out the operation of mounting the circuit elements on the printed circuit board 18 at the ten circuit element mounting positions predetermined on the printed circuit board 18 with respect to the respective chip type circuit elements within a range indicated by $P_3$ in FIG. 4. Thereafter, the mounting head 44 is returned to the transfer position $P_1$ at the forward portion of the feed means 50.

Figure 5:
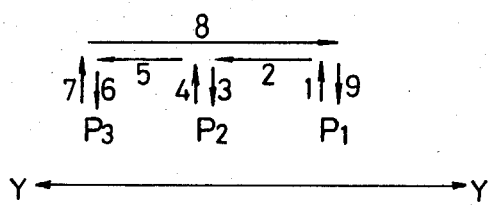
FIG. 5 is a schematic diagram showing an order of movements in the Y-axis direction and vertical direction.

FIG. 5 shows the Y-direction movement and vertical movement of each of the suction pins 46 at the positions $P_1$, $P_2$ and $P_3$ in FIG. 4. In FIG. 5, numerals assigned to arrows indicate the order of movements. In the illustrated apparatus, the number of the circuit element mounting positions $P_3$ on the printed circuit board is ten, because ten such suction pins 46 are provided in the mounting head 44, so that the operation indicated by each of arrows 6 and 7 in FIG. 4 is repeated ten times. In this instance, the mounting operation at each of the positions $P_1$ and $P_2$, other than the position $P_3$, is common to the chip type circuit elements held on the respective suction pins 46, so that a time required for carrying out the operation of mounting one circuit element on a printed circuit board may be significantly shortened.

In the operation briefly described above, the most efficient movement of the mounting head 44 in the Y-direction is accomplished under the conditions that said mounting head is reciprocated only once in the Y-direction. The circuit elements are mounted on the printed circuit board 18, according to the distance from the centering and turning means 52, by means of the suction pins 46, after the centering and turning operation is completed at the centering and turning means 52. The mounting head 44 is returned to the original position $P_1$ after the last chip type circuit element is mounted on the printed circuit board 18 at the mounting position farthest from the centering and turning means 52 based on the Y-direction. Such conditions permit the movement of the mounting head 44 in the Y-direction to be minimized. In this instance, the practicing of the mounting operation in a manner such that the printed circuit board of which the mounting operation is completed is moved to the next station and a subsequent printed circuit board is supplied within a period of time during which the mounting head is returned to the original position further improves the operation efficiency.

Figure 6:
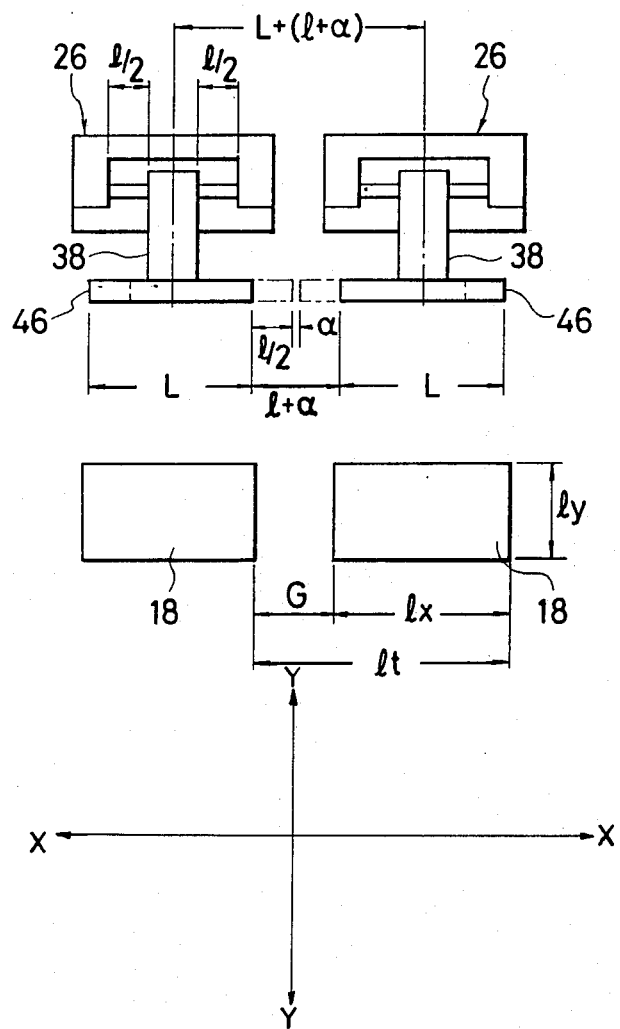
FIG. 6 is a schematic diagram showing the relationships between the distance l of movement of a mounting head in the X-axis direction and the distance between adjacent mounting heads.

FIG. 6 shows the relationships between the distance of movement of the mounting head in the X-direction and the distance between the adjacent mounted heads. In FIG. 6, L and l respectively indicate the length of the mounting head and the travel of the mounting head in the X-direction. Thus, $L+(1+\alpha)$ indicates the distance between the adjacent mounting heads, wherein $\alpha$ is the width of a gap defined between the adjacent two mounting heads when they are moved in the direction of approaching each other. Also, when the lengths of the printed circuit board in the X- and Y-directions are respectively represented by $l_x$ and $l_y$ and the width of the gap between the printed circuit boards is represented by G, as shown in FIG. 6, the pitch $l_t$ of the feed of the printed circuit board can be represented by $G+l_x$. As may be seen from FIG. 6, a decrease in travel l of the mounting head in the X-direction permits the distance between the mounting heads to be decreased. Thus, a production line organized by arranging a plurality of the apparatus along the transport means is substantially decreased in total length and the range of the suction pin covering the printed circuit board is decreased. Also, the shortening of the distance between the mounting heads permits the pitch $l_t$ of the feed of the printed circuit board to be decreased, to thereby further shorten the time required to feed the printed circuit board.

Figure 7:
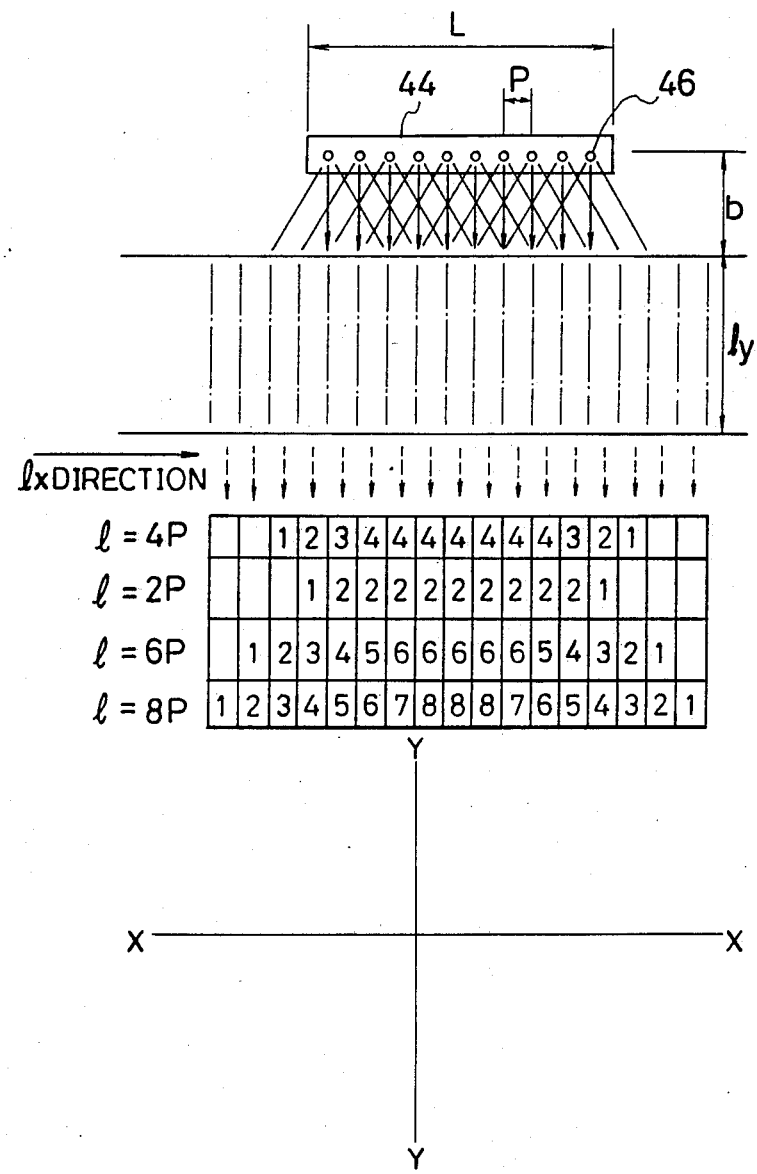
FIG. 7 is a schematic diagram showing the relationships between the distance l of movement of a mounting head in the X-axis direction and the number of suction pins covering zones divided along the X-axis direction of a printed circuit board.

FIG. 7 shows the relationships between the travel of the mounting head and the number of suction pins covering zones defined on the printed circuit boards, wherein the pitch between the arranged suction pins 46 is indicated by P and the travel l of the mounting head 44 in the X-direction is determined to be equal to 4P. In this instance, supposing that the printed circuit board has zones divided at the pitch P between the suction pins 46 in the X-direction, the individual suction pins 46 may be moved by a distance corresponding to 2P in each of the left and right directions. Thus, seven central zones of the printed circuit board can be covered by four suction pins, and the number of suction pins gradually decreases with distance from the center of the printed circuit board. Similarly, when l=2P, l=6P and l=8P, the number of suction pins covering each zone of the printed circuit board is as shown in FIG. 7. Thus, it will be noted that the central zones of the printed circuit board are covered by many suction pins and the number of suction pins covering the other zones is gradually decreased with the distance from the center of the board. Also, when the travel l of the mounting head is greater than the overall length of arrangement of the arranged suction pins, all the zones may be covered by any of the suction pins. Furthermore, when the travel l is greater than the sum of the length $l_x$ of the printed circuit board in the X-direction and the overall length of arrangement of the suction pins, all the suction pins can cover the printed circuit board. However, an increase in l causes the distance between the mounting heads to be increased as described above, so that a production line to be organized may be significantly lengthened. In fact, the organization of a production line is carried out using a plurality of such apparatus as described above, thus, it will be possible to select the circuit element mounting positions in a manner such that a decrease in number of the suction pins covering the end zones of the printed circuit board does not adversely affect the operation efficiency. For example, it will be more convenient to set l below the sum of the overall length of arrangement of the suction pins and the length of the printed circuit board in the X-direction. Also, such selection permits the mounting head to be moved for a short period of time in the X-direction with respect to the ten circuit element mounting positions on the printed circuit board to carry out the mounting operation at a high speed. It should be noted that it is not necessarily required that the travel l of the mounting head in the X-direction be set to be a multiple of the pitch P between the arranged mounting heads.

The kinds of chip type circuit elements to be mounted is basically determined to be the same as the number of suction pins. However, it is possible to render the kinds of circuit elements twice as large along with the suction pins by reducing the pitch between the circuit elements by ½ and shifting each of the circuit elements half the pitch. Also, the process of the invention may be constructed in a manner which automatically replaces the overall circuit element feed section or alters the kind of chip type circuit elements to be mounted by means of a sequencer.

A production line may be organized by arranging a plurality of the apparatus shown in FIGS. 2 and 3 and further using a loader for automatically feeding printed circuit boards to the apparatus provided at the forward end of the line, an unloader for automatically receiving printed circuit boards therein which is arranged at the rear end of the line, a buffer for adjusting the balance of the line, means for feeding adhesive to printed circuit boards, a checker for checking the mounting of circuit elements on printed circuit boards, and the like, as desired.

As may be determined from the foregoing, the circuit element mounting process of the illustrated embodiment is capable of simplifying the procedure of the operation from the feeding of chip type circuit elements to the mounting of the elements on printed circuit boards and decreasing the frequency of shifting circuit elements by the mounting heads to minimize the occurrence of trouble, and to thereby carry out the mounting operation with high reliability. Also, the process is simple in structure and permits apparatus to be used to be divided into units. Furthermore, the process of the illustrated embodiment permits the circuit element feed means and mounting head to be used in a manner common to a plurality of the suction pins.

FIGS. 8 to 11 illustrate an embodiment of apparatus for mounting chip type circuit elements on printed circuit boards in accordance with the invention. Apparatus of the illustrated embodiment is also adapted to be used for practicing the circuit element aforedescribed mounting process.

The apparatus illustrated in FIGS. 8 to 11 includes a frame base 10, which has a printed circuit board or substrate, and transport or conveyor means 12 arranged on the forward portion thereof. The transport means 12 is adapted to movably support printed circuit boards 18 on which chip type circuit elements 58 are to be mounted and includes a pair of slide rails 14, a conveyor belt (not shown) for slidably moving the printed circuit boards in a predetermined direction on the slide rails 14, positioning means (not shown) for positioning a printed circuit board 18 at a predetermined position at the time of mounting chip type circuit elements thereon, and a stop (not shown) for stopping the printed circuit board 18 at the predetermined position. The conveyor belt, positioning means and stop may be constructed in substantially same manner as those in the apparatus shown in FIGS. 2 to 4.

The apparatus of the illustrated embodiment also includes a support frame 24 arranged above the printed circuit board conveyor means 12, so as to cover it. An X-Y table head 26 is provided in the support frame 24. The X-Y table head 26 comprises an X-direction slide shaft 36 mounted on the support frame 24, an X-direction screw shaft 60, an X-direction slider 38 supported on the X-direction slide shaft 36, so as to be slidable in the X-direction, and threadedly engaged with the X-direction screw shaft 60 to be driven by an X-axis motor, a Y-direction slide shaft 28 arranged on the side of the X-direction slider 38, a Y-direction screw shaft 30, and a Y-direction slider 32 supported on the Y-direction slide shaft 28, so as to be slidable in the Y-direction, and threadedly engaged with the Y-direction screw shaft 30 to be driven in the Y-direction by a Y-axis motor 34.

The apparatus of the illustrated embodiment further includes a mounting head 44 of the multiple suction pin type fixedly arranged on the lower end of the Y-direction slider 32. In the illustrated embodiment, the mounting head 44 includes ten suction pins 46 arranged at equal intervals in the X-direction. Attached to each of the suction pins 46 is an air cylinder 48 which serves to vertically move said suction pin. Furthermore, the apparatus of the illustrated embodiment includes feed mechanisms 50 arranged on the frame base 10 to feed chip type circuit elements to the mounting head 44 and centering and turning mechanisms 52 arranged between said feed mechanisms and the conveyor means 12. The feed mechanisms 50 and centering and turning mechanisms 52 are provided corresponding in number to the suction pins 46. The feed mechanisms 50 and centering and turning mechanisms 52 are arranged at equal intervals in the X-direction, so as to permit the intervals in the X-direction to coincide with those of the suction pins 46.

Chip tapes 54 are introduced to each of the feed mechanisms 50. Each of the chip tapes 54 has chip type circuit elements 58 (FIG. 10) carried thereon from a chip tape reel 56 supported at the rear portion of the frame base 10. In the illustrated embodiment shown in FIG. 10, each of the chip tapes 54 is formed by bonding a cover tape 64 onto an embossed tape body 62 having the chip type circuit elements 58 therein. Alternately, the chip tape 54 may comprise a paper tape having a plurality of through-holes in which chip type circuit elements are received therein and lids cover the through-holes. The chip tapes 54 are formed to hold thereon chip type circuit elements 58 corresponding to the ten suction pins 46, respectively.

Figure 10:
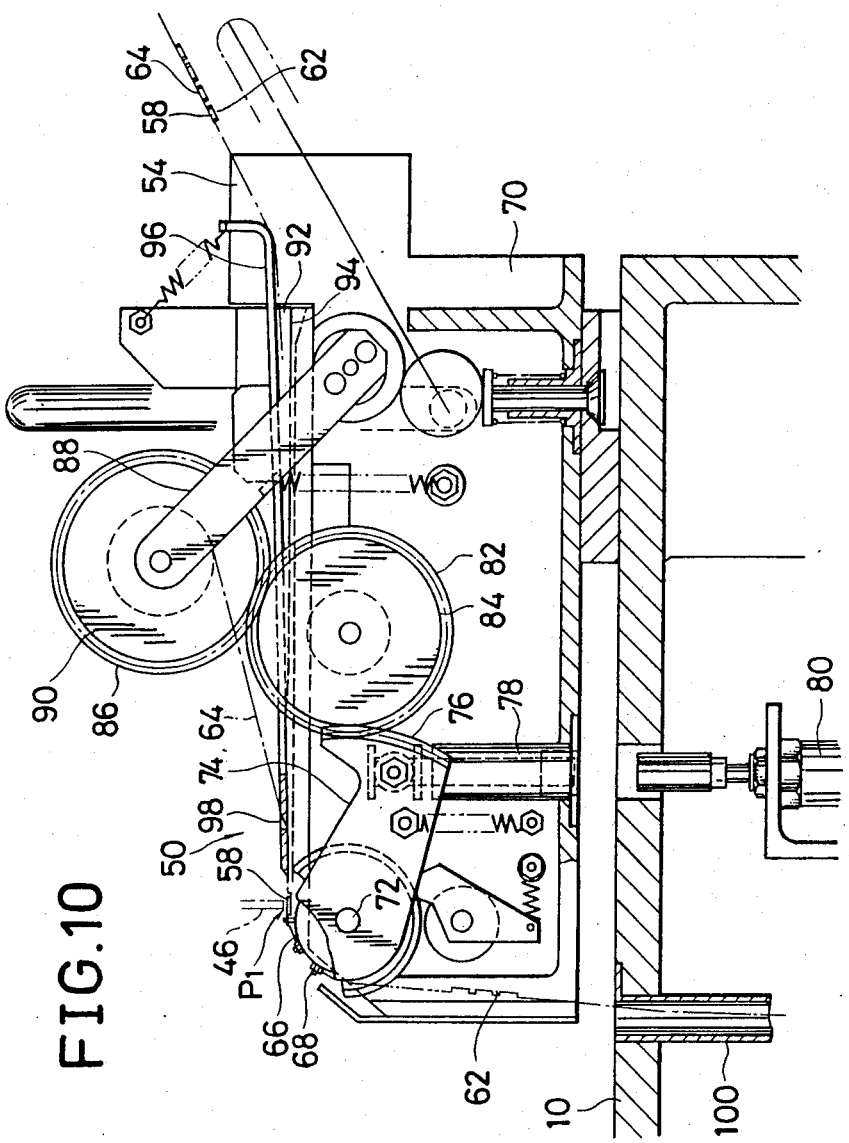
FIG. 10 is a side elevation view, partly in section, of one of the chip type circuit element feed mechanisms incorporated in the apparatus shown in FIG. 8.

Each of the feed mechanisms 50 is constructed in the manner shown in FIG. 10. More particularly, the feed mechanism 50 includes a feed wheel 66 which has pins 68 provided thereon, so as to be engaged with feed perforations of the chip tape 54 to forward the chip tape, and is supported on a feed frame 70. The feed wheel 66 is supported by a one-way clutch mechanism or a ratchet mechanism on a rotating shaft 72, on which an arm 74 is pivotally mounted at one end thereof, and the other end of the arm 74 is formed as a gear 76 and is connected at the portion in proximity to the other end thereof to the upper end of a rod 78 which is pushed upward by a driving air cylinder 80 provided on the side of the frame base 10 to extend upward through the base frame 10. The feed wheel 66 may thus be rotated one pitch corresponding to an angular interval between the adjacent two pins 68 due to one stroke (one extension) of the driving air cylinder 80. The gear 76 provided at the end of the arm 74 is engaged with a gear wheel 82 which is axially supported on the feed frame 70. A first friction wheel 84 is supported by a one-way clutch mechanism on the feed frame 70 in a manner whereby it is coaxial with the gear wheel 82 and engaged with a second friction wheel 86 rotatably mounted on one end of a support arm 88. The support arm 88 also has a reel 90 rotatably mounted thereon in coaxial relation with the second friction wheel 86. The second friction wheel 86 has a one-way bearing (not shown) provided therein which acts to regulate the rotation of said friction wheel.

In the feed mechanism 50 constructed as described above, the chip tape 54 introduced into a gap 92 between a feed guide surface 94 of the feed frame 70 and a feed guide member 96 from the chip tape reel 56 is subjected to a treatment of peeling the cover tape 61 in a tape peel groove 98 of said feed guide member and guided to the feed wheel 66, which intermittently feeds the peeled chip tape 54 one pitch at a time. The chip type circuit elements 58 received in the peeled chip tape 54 are exposed from the chip tape, so that the elements may be attracted at a transfer or shift position $P_1$ predetermined at the forward end of the feed mechanism 50 by means of the suction pins 46.

Figure 8:
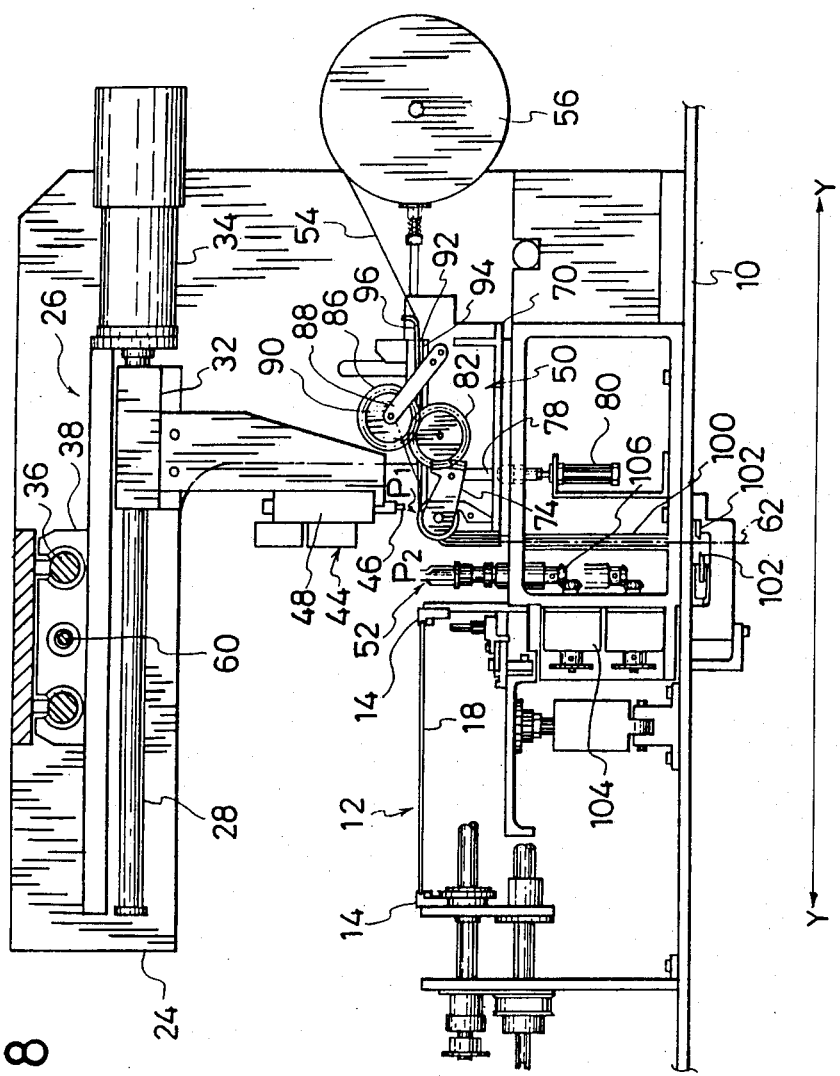
FIG. 8 is a side elevation view, partly in section, of an embodiment of apparatus for mounting chip type circuit elements on printed circuit boards in accordance with the invention.
Figure 9:
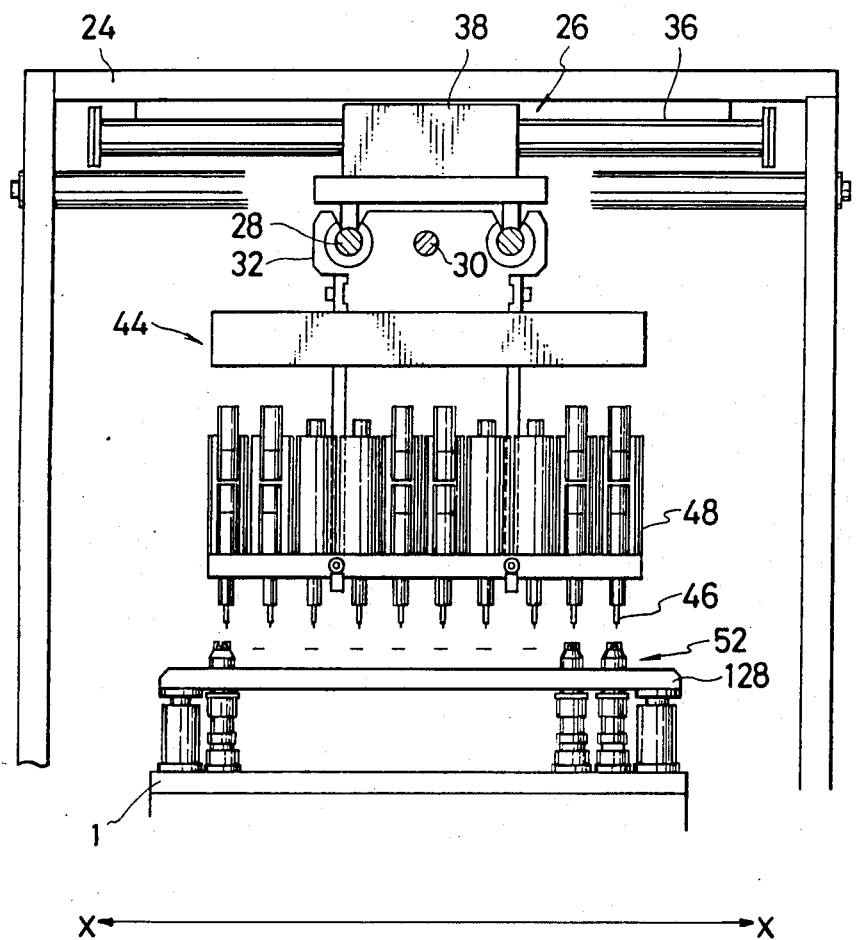
FIG. 9 is a front elevation view, partly in section, showing the essential portion of the apparatus shown in FIG. 8.

The cover tape 64 removed from the chip tape 54 is wound on the reel 90. The embossed tape body 62 which has been rendered empty at the transfer position $P_1$ is guided through a tape discharge guide 100 below the frame base 10. The tape body 62 is cut into a predetermined length by cutters 102 at the tape discharge guide 100, as shown in FIG. 8.

Figure 11:
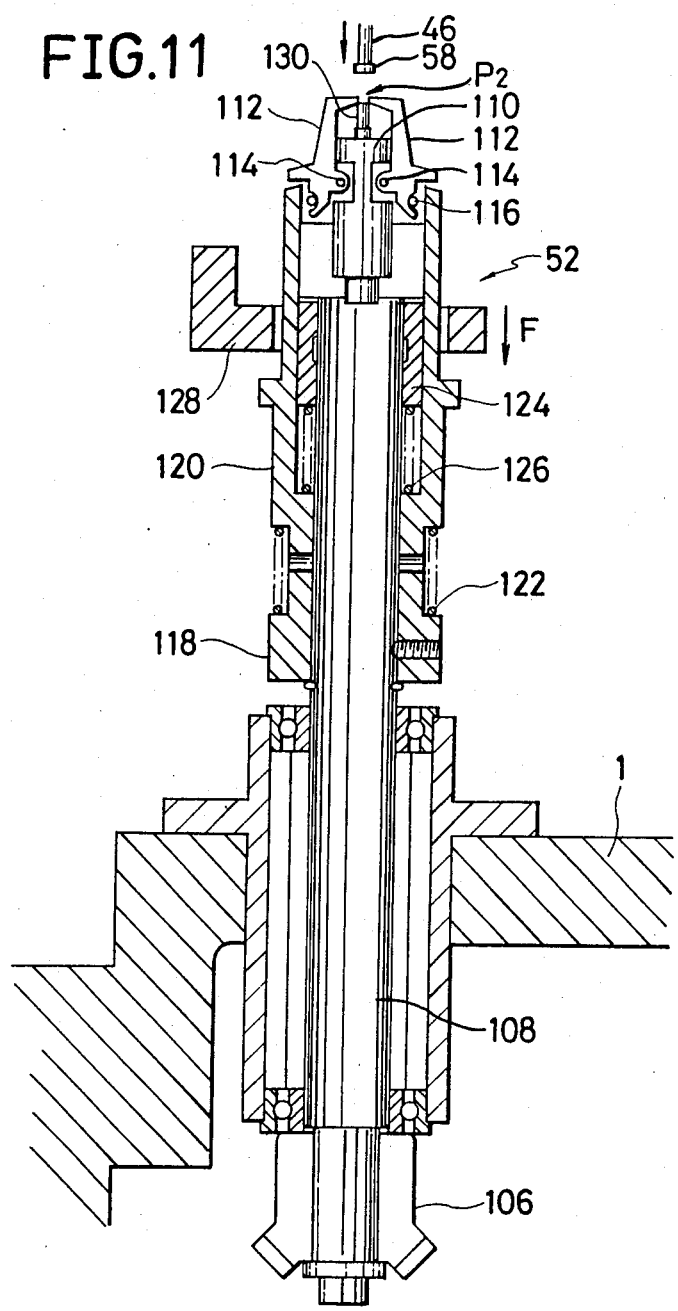
FIG. 11 is a side elevation view, in section, of a chip type circuit element centering and turning mechanism incorporated in the apparatus shown in FIG. 8.

The centering and turning mechanisms 52 are arranged corresponding to the ten suction pins 46 and adapted to carry out the centering and turning operation independent from one another. A pulse motor 104 is arranged with respect to each of the centering and turning mechanisms 52, as shown in FIG. 8. As shown in FIG. 11 the output of rotation of the pulse motor 104 is transmitted through a gear mechanism 106 to a rotating shaft 108 vertically extending through the frame base 10. Mounted on the upper end of the rotating shaft 108 is a rotating block 110, which has a pair of first holding levers 112 pivotally mounted on a first surface thereof by pivot pins 114. Similarly, the rotating block 110 is also provided on a second surface perpendicular to the first surface with a pair of second holding levers in substantially the same manner, although they are not shown in FIG. 11. Thus, the centering and turning mechanism includes two pairs of the holding levers 112 for centering a chip type circuit element. The pairs of holding levers 112 are arranged to be perpendicular to each other. Each of the holding levers 112 is provided at the lower end thereof with a spring member 116 which serves to bias the holding lever in the direction of opening the upper distal end of said holding lever. Also, the rotating shaft 108 has a stop block 118 fixedly fitted on the intermediate portion thereof and a first pushed-up member 120 provided therearound which is forced upward with respect to the stop block 118 by a spring 122. The first pushed-up member 120 serves to operate a pair of the first holding levers 112. A second pushed-up member 124 is arranged around the rotating shaft 108. The second pushed-up member 124 is adapted to be forced upward with respect to the first pushed-up member 120 by means of a compression spring 126. The first and second pushed-up members 120 and 124 act to operate the first holding levers 112 and second holding levers (not shown). For this purpose, each of the first and second pushed-up members 120 and 124 is engaged at the upper end thereof with the lower ends of the corresponding holding levers. The centering and turning mechanism 52 also includes an actuation member 128 common to both the first and second pushed-up members 120 and 124. A pin 130 is provided on the rotating block 110 to put a chip type circuit element 58 thereon.

In each of the centering and turning mechanisms 52 constructed in the aforedescribed manner, when the actuation member 128 is moved downward, as indicated by an arrow F in FIG. 11, the pushed-up members 120 and 124 are moved in the same direction to cause the two pairs of the holding levers 112 to open at the tip ends thereof, so that the centering and turning mechanism may be prepared to carry out the centering operation.

The manner of operation of the apparatus of the embodiment of FIGS. 8 to 11 is described hereinafter.

First, the mounting head 44 is moved to the circuit element transfer or shift position $P_1$ provided at the forward end of the feed mechanism 50, and then the air cylinders 48 are actuated to move the suction pins 46 downward together, so that said suction pins extract chip type circuit elements 58 due to vacuum suction from the embossed tape bodies 62 from which the cover tapes 64 have been removed. Then, the suction pins 46, having the circuit element held thereon, are moved upward by the air cylinders 48.

Subsequently, the mounting head 44 is moved to a position $P_2$ (FIG. 11) above the centering and turning mechanisms 52. At such time, the actuation member 128 is at the lowering position to cause the two pairs of the holding levers 112 to open at the tip ends thereof. Then, when each of the air cylinders 48 is actuated again to cause the actuation member 128 to be moved upward, the vacuum applied to the suction pin 46 is released and said two pairs of said holding levers clamp the chip type circuit element together to carry out the circuit element centering operation and, as desired, the circuit element turning operation (for example, an angle of 90 or 45 degrees) due to the rotation of the pulse motor 104. After the centering and turning operation, a vacuum is applied to each of the suction pins 46 to permit the suction pin to hold the circuit element by vacuum suction, and the suction pin 46 is then raised and moved to the printed circuit board. Subsequently, the suction pins 46 are positioned with respect to the ten circuit element mounting positions by moving the mounting head in the X- and Y-directions, and progressively carry out the circuit element mounting operation. Thereafter, the mounting head 44 is returned to the transfer or shift position $P_1$.

Thus, it will be noted that the mounting apparatus shown in FIGS. 8 to 11 permits the time required to mount one chip type circuit element on the printed circuit board to be significantly reduced, because operation at the positions other than the mounting position on the board is carried out commonly to the respective chip type circuit elements.

In the operation briefly described hereinbefore, the most efficient movement of the mounting head 44 in the Y-direction is accomplished under the conditions that the mounting head is reciprocated only once in the Y-direction, the circuit elements are mounted on the printed circuit board 18 according to distance from the centering and turning means 52 by means of the suction pins 46 after the centering and turning operation is completed at said centering and turning means 52, and said mounting head 44 is returned to the original position $P_1$ after the last circuit element is mounted on said printed circuit board at the mounting position farthest from said centering and turning means 52 based on the Y-direction. Such conditions permit the movement of the mounting head 44 in the Y-direction to be minimized. In this instance, the practice of the operation in a manner whereby the printed circuit board on which the mounting operation is completed is moved to the next station and a subsequent printed circuit board is supplied within a period of time during which the mounting head is returned to the original position, further improves the operation efficiency of the apparatus.

The kinds of chip type circuit elements to be mounted are basically determined to be the same as the number of suction pins. However, it is possible to render the kinds of circuit elements twice as large as the suction pins by reducing the pitch between the circuit elements by half and shifting each of the circuit elements half a pitch. Also, the illustrated embodiment may be constructed in a manner which automatically replaces the overall circuit element feed section or alters the kind of circuit elements to be mounted by means of a sequencer.

As may be seen from the foregoing, the circuit element mounting apparatus of the illustrated embodiment is capable of the simplifying the procedure from the feeding of chip type circuit elements to the mounting on the printed circuit boards and decreasing the frequency of shifting circuit elements by the mounting heads to minimize the occurrence of trouble, to thereby carry out the mounting operation with high reliability. Also, the apparatus is simple in structure and can be divided into units. Furthermore, the apparatus of the illustrated embodiment permits the circuit element feed means and mounting head to be used in common with a plurality of the suction pins.

FIGS. 12 and 13 show a circuit element mounting head adapted to be used in the circuit element mounting apparatus of the invention and constructed to simplify the structure of said mounting apparatus.

In FIGS. 12 and 13, a casing 140 for an air cylinder has an interior divided into a cylinder chamber 142 and a vacuum chamber 144 by a partition member 146. A piston 148 for the air cylinder comprises a lower rod portion 150 projecting downward from the lower end surface of the casing 140 and an upper rod portion 152 extending through the partition member 146 into the vacuum chamber 144 and arranged to be slidable with respect to the cylinder chamber 142. The lower and upper rod portions 150 and 152 are formed integrally with each other. The piston 148 has a vacuum suction passage 154 formed therein which extends from the forward or lower end surface of the lower rod portion 150 to the rear or upper end surface of the upper rod portion 152. Connected to the lower end of the lower rod portion 150 of the piston 148 is at least one suction pin 46 of pipe-like shape having a through-hole formed therein. The upper rod portion 152 of the piston 148 is securely provided at the upper end surface thereof with an air filter 156. The air filter may comprise, for example, a perforated block. The piston 148 is constantly urged in the upward direction by a return spring 158.

The mounting head also includes a vacuum valve 160 and an air valve 162 mounted on the outside of the air cylinder case 140. The vacuum valve 160 may comprise a changeover valve which is adapted to be connected to vacuum piping at the time of sucking up a circuit element on the suction pin and to a release port at the time of releasing a circuit element from the suction pin, and the air valve 162 may comprise a changeover valve which carries out the changeover between a pressure circuit and a release circuit. The vacuum valve 160 communicates with the vacuum chamber 144 through a suction hole 164 formed through the casing 140, and the air valve 162 communicates through an air supply hole 166 formed through the casing 140 with the cylinder chamber 142. Also, the casing 140 has an exhaust hole 168 formed therethrough (FIG. 13). The exhaust hole 168 communicates with the lower portion of the cylinder chamber 142. The piston 148 has a magnet 170 embedded therein, and the casing 140 has a magnet sensor 172 affixed to the outside thereof which serves to detect the position of said magnet when said piston is at the raising position. Also, the piston 148 has an opening 174 formed at the upper end thereof. A vacuum sensor is connected to the casing 140 via the opening 174. An annular cushion spring 176 is fitted on the piston 148 and is adapted to abut against the lower wall of the cylinder chamber 142 to restrict the downward movement of said piston to a given level, when said piston is moved downward.

An air cylinder acts as an extruding single action cylinder in the mounting head 44, constructed as hereinbefore described. More particularly, when the air valve 162 is opened and compressed air is supplied through the air supply hole 166 to the cylinder chamber 142, the piston 148 is moved downward, resulting in the lowering of the suction pin 46 connected to the lower rod portion 150 of said piston. The lowering of the piston 148 is limited due to the abutment of the cushion spring 176 and the lower wall of the cylinder chamber 142. The return of the suction pin 46 to the raising position is carried out by placing the air valve 162 in an evacuated state and causing the cylinder chamber 142 to communicate with the atmosphere. This results in the piston 148 being returned to the raising position, due to the force of the return spring 158.

The sucking-up of a chip type circuit element on the suction pin 46 is carried out by opening the vacuum valve 160 and applying vacuum through the suction hole 164, the vacuum chamber 144, the air filter 156 and the vacuum suction passage 154 of the piston 148, to said suction pin. Even when foreign matter such as dust, or the like, enters the vacuum suction system through the suction pin during the suction operation, the air filter 156 positively catches it to prevent it from reaching the vacuum valve 160, to thereby ensure the effective operation of the vacuum valve.

Thus, it will be noted that the aforedescribed mounting head eliminates connection means, such as a tube, for connecting the air filter and vacuum valve to the air cylinder to highly simplify the structure, because the air filter is arranged in the air cylinder.

Figure 15:
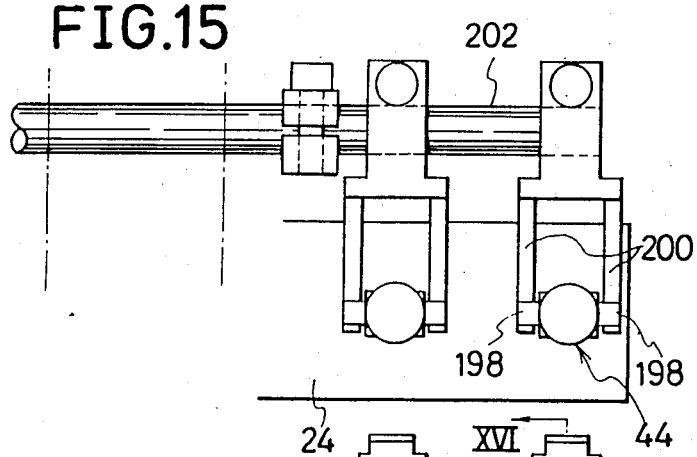
FIG. 15 is a plan view showing the arrangement of a plurality of the mounting heads of FIG. 14 on a support frame.
Figure 16:
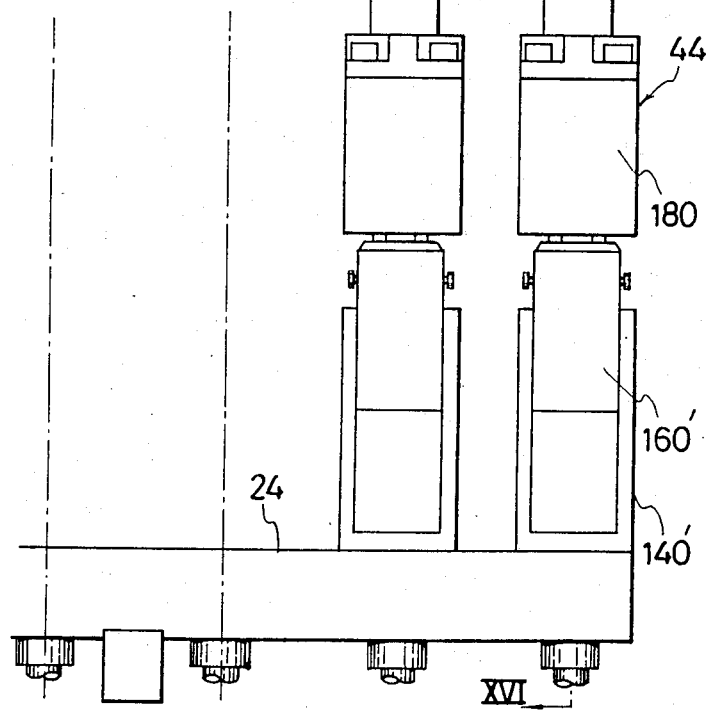
FIG. 16 is a front elevation view of FIG. 15.

FIGS. 14 to 18 show another modification of a mounting head which is adapted to be used in the mounting apparatus of the invention. In the modification of FIGS. 14 to 18, a plurality of mounting heads 44 of the single suction pin type are vertically arranged on frame base 24 at equal intervals, as shown in FIGS. 15 and 16. Each of the mounting heads 44 is constructed in the same manner.

The mounting head 44, as shown in FIG. 14, which is a sectional view taken along the lines XVI—XVI of FIG. 16, includes a support member 140' fixedly mounted on the frame base 10, so as to extend upward, a rod 148' supported in said support member, so as to be slidable in the vertical direction with respect to said support member, and a vacuum valve 160 and an electromagnetic plunger 180, each fixedly arranged on the outside of said support member. The vertical rod 148' has a lower end to which a suction pin 46 is adapted to be connected. The suction pin 46 is of hollow cylindrical shape, for example. A vacuum suction passage 154 is formed in the rod 148' and is opened to the lower end thereof so that it communicates with the suction pin 46 connected thereto. Also, the vertical rod 148' has a vertically extending slot 182 formed in the side thereof and the support member 140' has a through-hole 166 formed therethrough. The vacuum valve 160 communicates through the suction passage or through-hole 166 and the slot 182 with the vacuum suction passage 154 of the vertical rod 148'. Furthermore, the vertical rod 148' has a recess 184 formed on the outer surface thereof. The recess 184 is adapted to be engaged with a turn-stop member 186 fixedly attached to the support member 140'.

The vertical rod 148' has a vertically extending groove 188 formed on the outer surface thereof. The groove 188 is adapted to be engaged with a locking pawl member 190 pivotally mounted on the support member 140'. The locking pawl member 190 is connected at the upper end thereof to the electromagnetic plunger 180, and is adapted to be fittedly engaged with the groove 188 via an extension spring 192 when said electromagnetic plunger is not actuated, so that the vertical rod 148' may be locked at the raised position. When the electromagnetic plunger 180 is actuated to be retracted, the locking pawl member 190 is disengaged from the groove 188 to permit the vertical rod 148' to be freely moved in the vertical direction. A hollow spring suppression member 194 is threadedly affixed to the upper surface of the support member 140'. The hollow spring suppression member 194 is closed at the upper end thereof and opened at the lower end thereof. A spring 196 is provided in the spring suppression member 194 and is compressedly interposed between the upper end of said spring suppression member and the upper end of the vertical rod 148', so that said rod may be constantly biased downward by said spring.

Figure 17:
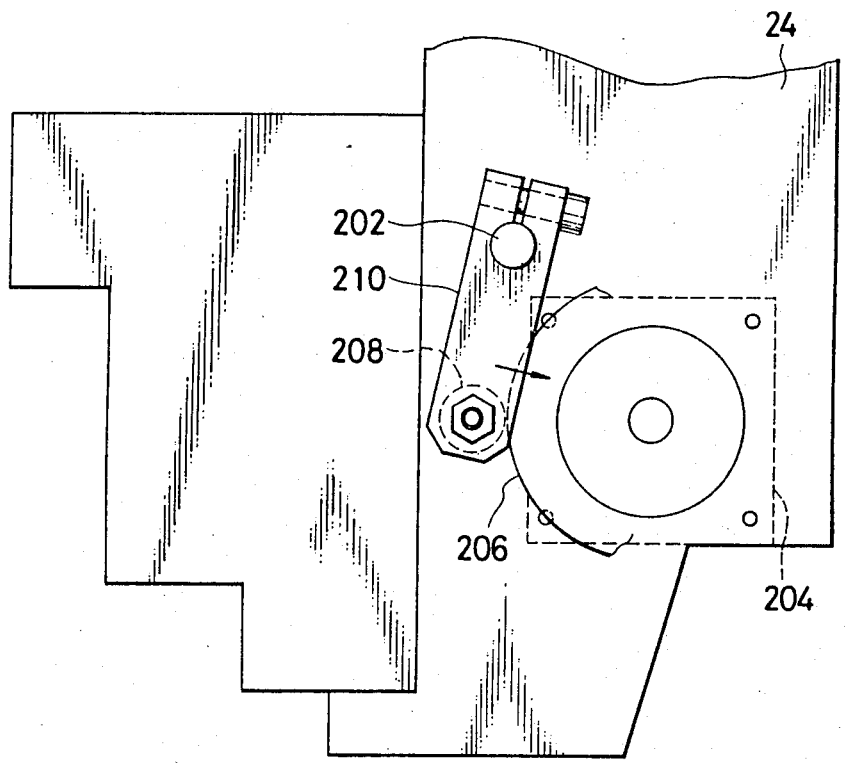
FIG. 17 is a side view showing a cam drive portion of the mounting head shown in FIG. 15.
Figure 18:
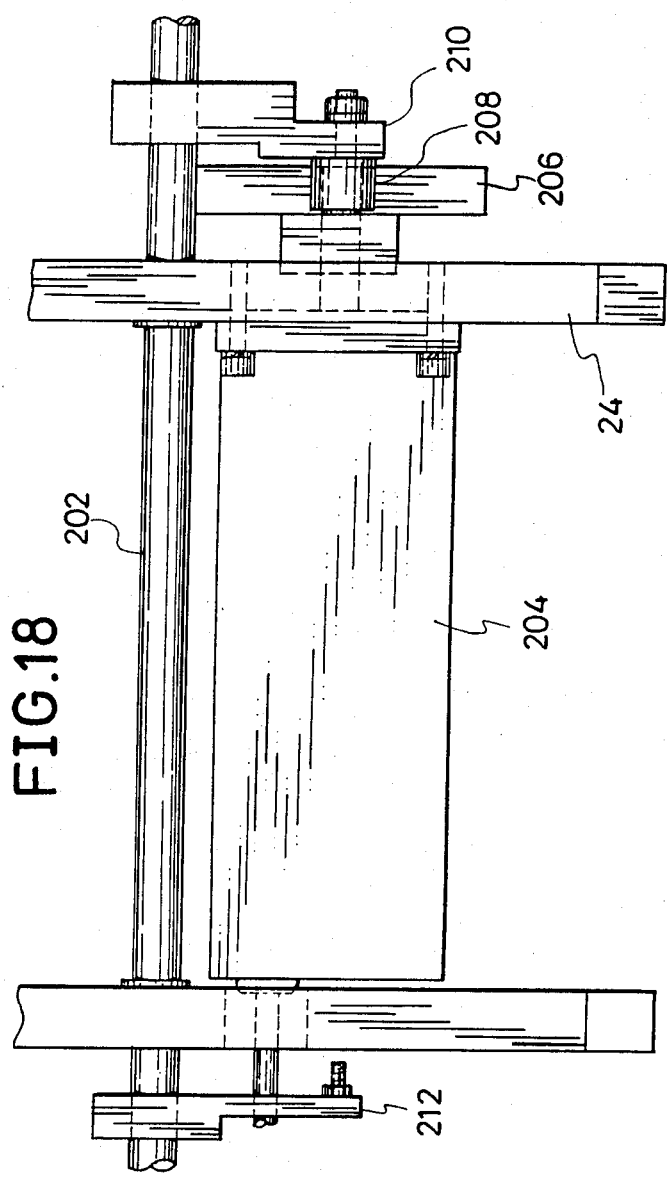
FIG. 18 is a front elevation view of FIG. 17.
Figure 19:
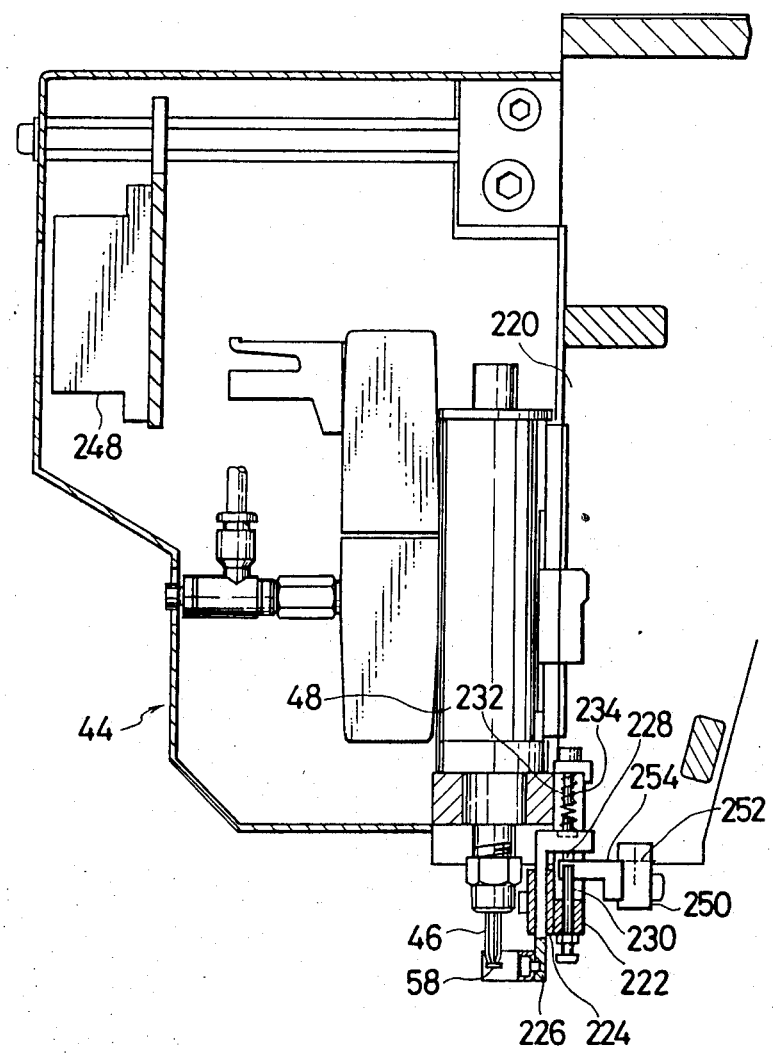
FIG. 19 is a right side elevation view, partly in section, of a detection mechanism for detecting a chip type circuit element sucked up on a suction pipe.

The vertical rod 148' has horizontal pins 198 affixed to both sides of the portion thereof between the groove 188 and the upper end thereof, which acts to receive the driving force from the exterior. Each of the pins 198 is engaged at the lower portion thereof with the upper surface of each of follower arms 200 fixedly mounted on a cam follower shaft 202, as shown in FIG. 15, so as to act as a follower member. The cam follower shaft 202 extends substantially in the longitudinal direction thereof so as to be used as a support shaft common to a plurality of the mounting heads 44. As shown in FIGS. 17 and 18, a servo-motor 204 is affixed to the frame base 24. The servo-motor 204 has a rotating shaft on which a cam 206 is fixedly mounted and is abutted against a roller 208 pivotally mounted at the distal end of a cam follower 210 fixed on the cam follower shaft 202. The cam 206 is formed in a shape which permits one rotation of said cam to carry out one cycle of reciprocating movement of the follower arm 200 from the raising position through the lowering position to the raising position and permits said follower arm to carry out the movement at a low speed at the raising and lowering position and at a high speed at the intermediate position. Furthermore, the cam follower shaft 202, as shown in FIG. 18, has an arm 212 fixedly mounted thereon to be opposite to the cam follower 210 in a manner such that the servo-motor 204 is interposed therebetween. The arm 212 is forced by means of a spring (not shown in the direction of forcedly abut the roller 208 against the cam 206.

The manner of operation of the aforedescribed mounting head will be described hereinafter with reference to FIGS. 14 to 18.

The reciprocating rotation of the cam follower shaft 202, due to the rotation of the cam 206, actuates the follower arm 200 corresponding to each of the mounting heads 44 selected. In each of the unselected mounting heads, the electromagnetic plunger 180 is not actuated, to keep the vertical rod 148' in a state of being held at the raising position, so that the suction pin 46 at the lower end of said vertical rod is stopped at the raising position. In each of the mounting heads selected, when the electromagnetic plunger 180 is actuated to disengage the locking pawl member 190 from the groove 188, the vertical rod 148' starts to be moved downward with the downward movement of the distal end of the follower arm 200. The speed of movement of the rod 148' reaches the maximum value at the intermediate position and gradually decreased toward the lowering position. When the rod 148' reaches the lowering position, a chip type circuit element 58 sucked up at the lower end of the suction pin 46 is forced against a printed circuit board 18 to be mounted thereon. At such time, the impact applied to the circuit element 58 is minimized, because the rod 148' is minimized in downward speed or substantially stopped. Thereafter, the rod 148' is returned to the raising position with the movement of the follower arm 200.

In the positioning and turning of the chip type circuit element sucked up on the suction pin 46, the cam 206 is stopped after its half rotation and then carries out the remaining half rotation. Accordingly, the vertical rod 148' is stopped once to carry out the positioning and turning of the circuit element after it is moved from the raising position to the lowering position, and then is returned to the raising position.

As can be seen from the foregoing, the mounting head shown in FIGS. 14 to 18 is constructed to actuate the suction pin by means of the vertical rod driven by the cam rather than an air cylinder, so that ideal motion characteristics which minimizes acceleration applied to the chip type circuit element may be exhibited in the vertical movement of said suction pin. More particularly, the circuit element is moved at a low speed at the raising and lowering positions and at a high speed at the intermediate position, to thereby minimize acceleration applied to the circuit element and to significantly increase the overall vertical movement. Also, the cam mechanism is actuated with high reliability as compared with an air cylinder used in the conventional mounting head, so that the independent operations may be accomplished in a manner to be overlapped with each other. It is possible, for example, to start the movement of the vertical rod before an X-Y table head is completely stopped. Thus, it will be noted that the mounting head shown in FIGS. 14 to 18 permits the whole mounting operation to be carried out at a high speed and with improved reliability.

The mounting apparatus of the invention may include a detection mechanism for detecting a chip type circuit element sucked up on a suction pin. FIGS. 19 to 22 show a detection mechanism which is adapted to be used in the mounting apparatus of the invention. The detection mechanism shown in FIGS. 19 to 22 is adapted to be used for a mounting head of the multiple suction pin type and is arranged with respect to each of the suction pins. The mounting head 44 includes a head frame 220, a plurality of air cylinders 48 fixedly arranged at equal intervals on the head frame 220 and a plurality of suction pins 46 each connected to the corresponding air cylinder 48 to suck up and hold a chip type circuit element thereon. The head frame 220 has a support plate 222 affixed thereto for every suction pin 46. A stationary support member 224 is affixed to the head frame 220 and slidably supports an inverted L-shaped slider 226 acting as a movable support member. The inverted L-shaped slider 226 is arranged for every suction pin 46 in a manner whereby it is vertically movable with respect to the stationary support member 224. Each of the sliders 226 has a screw 228 threadedly engaged therein and is provided with a stop bolt 230 for regulating the lowering position of each said slider. Also, the support plate 222 has a spring pin 232 securely inserted therein which serves to support thereon a compressed coiled spring 234 for moving the slider 226 downward, so that said slider may be forced downward by said compressed spring.

The inverted L-shaped slider 226 acting as the movable support member is provided with a light detecting section having a single photosensor comprising a light emitting portion 236 and a light receiving portion 238, as shown in FIGS. 22 to 25, arranged on the side at the distal end of the suction pin, so as to be opposite each other. Also, a sleeve 240 is mounted on the slider 226 in a manner whereby it semicircularly surrounds the distal end of the suction pin 46. Each of the light emitting portion 236 and the light receiving portion 238 of the photosensor includes a converter for converting the light axis by 90 degrees. The converter has a mirror or prism therein. The light emitting portion 236 is adapted to convert the axis of light emitted from an optical fiber 242 by 90 degrees to discharge a light beam traversing the extension of the suction pin 46, and the light receiving portion 238 is adapted to receive the light beam and convert the axis of the light by 90 degrees to discharge the light from an optical fiber 244. In the illustrated detection mechanism, the sleeve 240 is formed with slit 246 which act to sufficiently narrow the light beam, so that the discharging and receiving of the light beam B (FIG. 23) may be carried out through said slits. The optical fibers 242 and 244 are connected to a photoelectric amplifier section 248 (FIGS. 19 and 21) provided on the side of the mounting head for every suction pin 46. A light signal fed from the light receiving portion 238 is converted into an electric signal by the amplifier section 248 and then amplified. When a space is provided around the suction pin 46 sufficient to bend the optical fibers 242 and 244, so that the distal end surfaces of the optical fibers may be opposed to each other, the light axis converter is not required.

Figure 20:
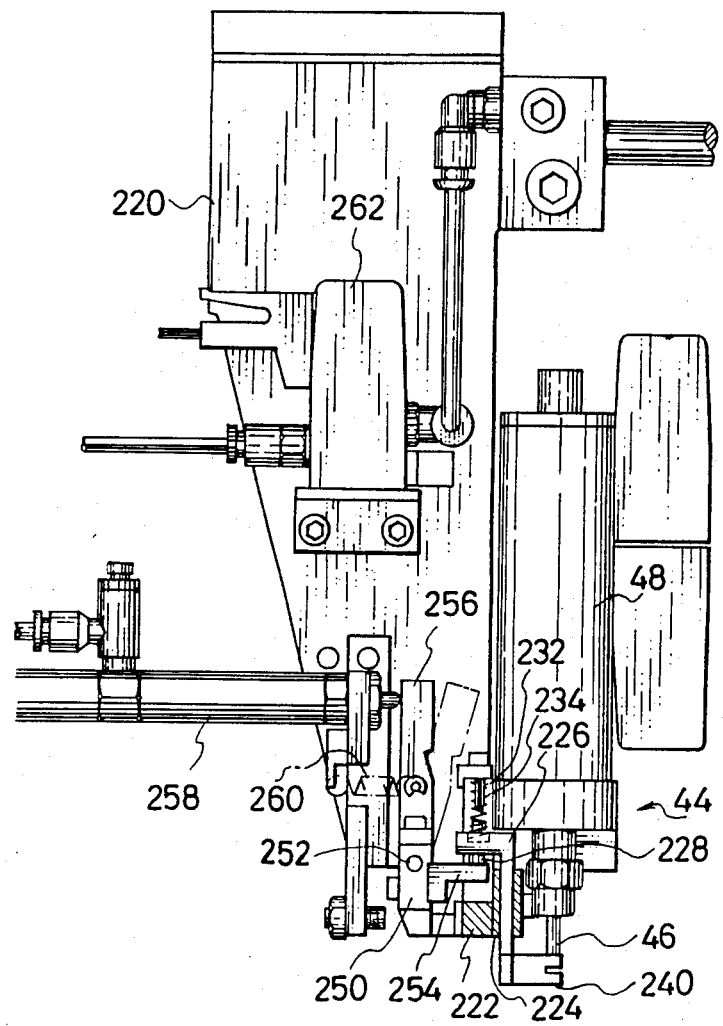
FIG. 20 is a left side elevation view, partly in section, of the detection mechanism shown in FIG. 19.
Figure 21:
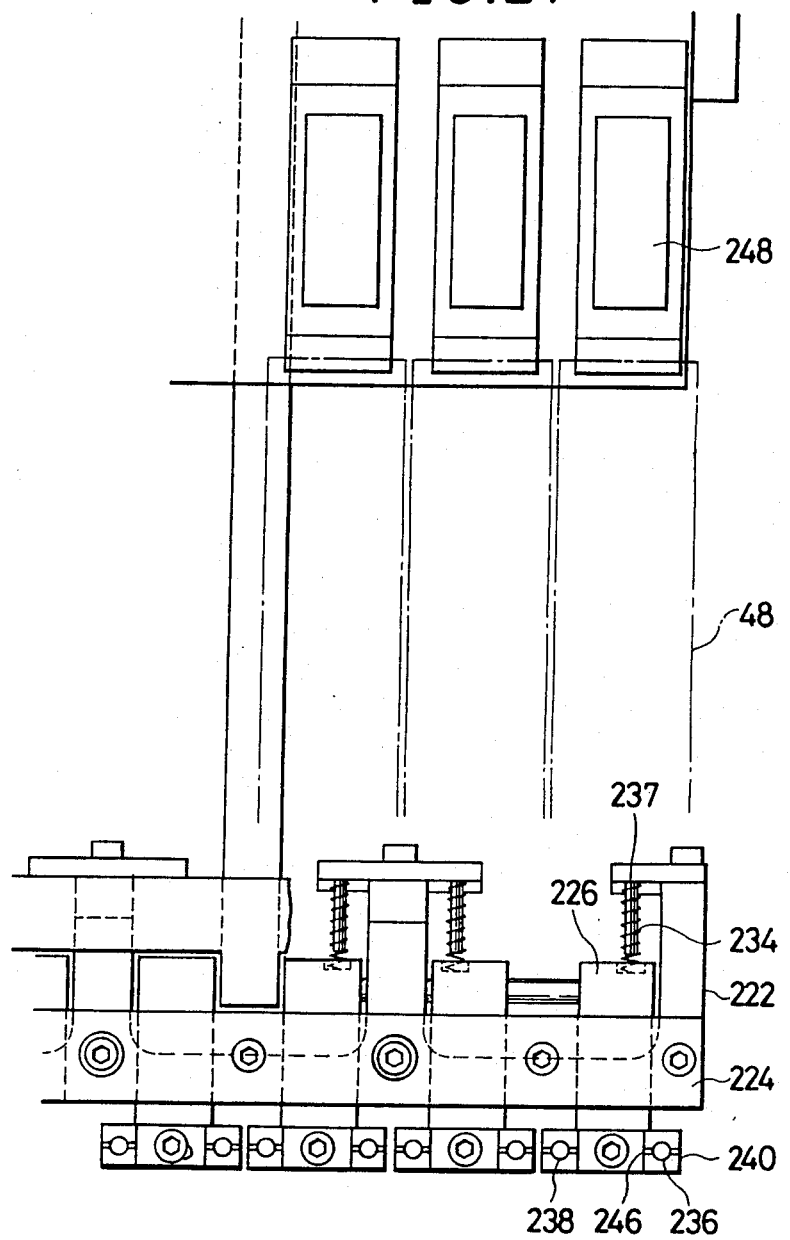
FIG. 21 is a front elevation view showing the essential portion of the detection mechanism shown in in FIG. 19.
Figure 22:
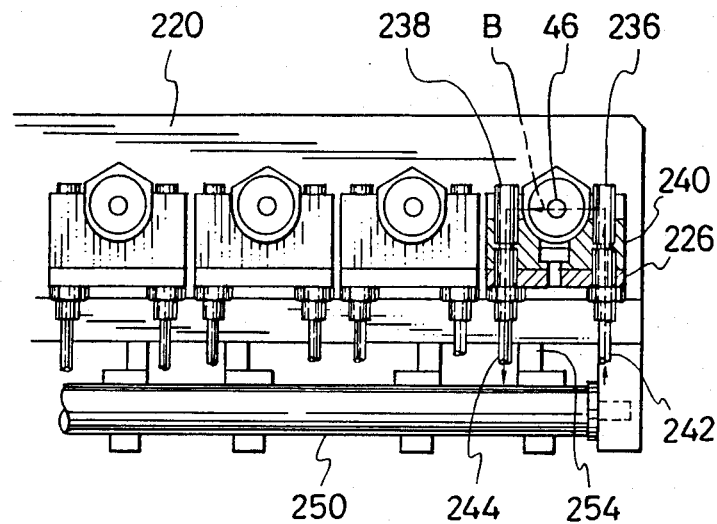
FIG. 22 is a bottom view, partly in section, of FIG. 21.

The head frame 220 also has a rectangular shaft 250 supported about a pivot 252, on which actuation arms 254 engaged with the inverted L-shaped sliders 226 and, more particularly, abutting the lower ends of the screws 228, are affixed. Furthermore, the rectangular shaft 250 has a lever 256 fixedly connected thereto, as shown in FIG. 20, which lever then abuts a rod of an air cylinder 258 fixed on the side of the head frame 220. The lever 256 is urge toward the direction of being forced into contact with the rod of the air cylinder 258 by an extension spring 260. Accordingly, this construction permits the rectangular shaft 250 and actuation arms 254 to be oscillated upon every movement of the rod of the air cylinder 258. A solenoid valve 262 is fixedly mounted on the head frame 220. The solenoid valve 262 controls the actuation of the air cylinder 258.

The operation of the aforedescribed detection mechanism is described hereinafter with reference to FIGS. 19 to 25.

Figure 23:
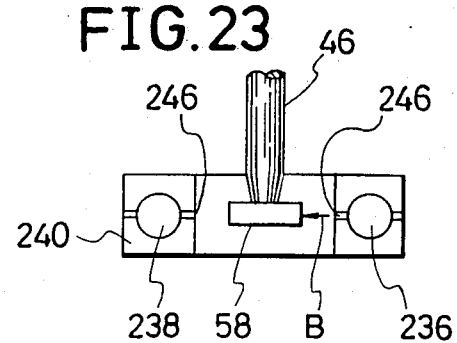
FIGS. 23, 24 and 25 are each a front elevation view showing the positional relationships between a sleeve and a suction pin in each stage of operation of the detection mechanism.

First, when the rod of the air cylinder 258 is actuated to retract, the lever 256 is then in a state indicated by solid lines in FIG. 20. The screw 228 of each of the inverted L-shaped sliders 226 is pushed up by the actuation arm 254, and the slider 226 and sleeve 240 are at the raising position, because the force of the extension spring 260 is stronger than the sum of the forces of the respective compressed springs 234. The positional relationships between the sleeve 240 at the raising position and the suction pin 46 at the raising position, obtained when the rod of the air cylinder 48 is retracted, are as shown in FIG. 23. In this instance, the height of the light beam B discharged from the light emitting portion 236 through the slit 246 to traverse the extension of the suction pin 46 is set at a level to permit a chip type circuit element 58 sucked up in a correct posture on said suction pin to intercept the light beam. Such setting is adjusted by the screw 228. Thus, the presence or absence of a chip type circuit element sucked up on the suction pin 46 is detected by the light beam B discharged from the sleeve 240 at the raising position. More particularly, when the light beam B discharged from the light emitting portion 236 is intercepted by a chip type circuit element 58, as shown in FIG. 23, a light signal fails to be generated at the light receiving portion 238. The sucking-up of a circuit element by a suction pin 46 may thus be detected. However, the light beam B discharged from the sleeve at the raising position fails to detect the posture of a circuit element sucked up on the suction pin 46. This is accomplished in the following manner.

Figure 24:
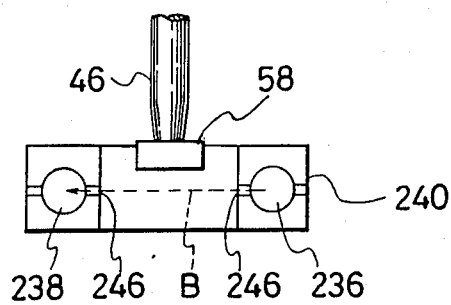
Figure 25:
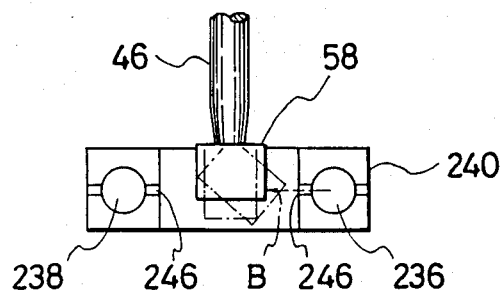

The air cylinder 258 is actuated to extend the rod, to thereby oscillate the lever 256 in the clockwise direction in FIG. 20. This causes the rectangular shaft 250 and the actuation arm 254 to be rotated in the clockwise direction to move the distal end of said actuation arm downward. This results in each of the inverted L-shaped sliders 226 and the sleeve 240 affixed thereto being moved to the lowering position. The positional relationships between the sleeve 240 at the lowering position and the suction pin 46 at the raising position obtained when the rod of the air cylinder 258 is retracted are shown in FIGS. 24 and 25. In this instance, the height of the light beam B discharged from the light emitting portion 236 through the slit 246 to traverse the extension of the suction pin 46 is set at a level to permit a chip type circuit element 58 sucked up on said suction pin in a correct posture, as shown in FIG. 24, not to intercept said light beam and a chip type circuit element 58 sucked up on said suction pin in a wrong posture, as shown in FIG. 25, to intercept the light beam. Such setting is carried out by means of the stop bolt 230. Thus, it will be noted that the detection of posture of a chip type circuit element 58 sucked up on the suction pin 46 may be accomplished by the light beam B discharged when the sleeve 240 is at the lowering position. When the light beam B discharged from the light emitting portion 236 reaches the light receiving portion 238, as shown in FIG. 24, a light signal is generated at the light receiving portion to detect the sucking-up of the circuit element in a correct posture. When the circuit element is intercepted, the signal fails to be generated, so that the sucking-up of the circuit element in a wrong posture may be detected.

The aforedescribed detection mechanism thus effectively detects the sucking-up of a circuit element 58 by the suction pin 46 in a correct posture, as well as the presence or absence of a circuit element sucked up on a suction pin. Also, the detection mechanism is most conveniently applied to a mounting head of the multiple suction pin type in which suction pins are arranged at small intervals. The detection mechanism has the additional advantage of being simplified in structure, although it is adapted to carry out the detection for every suction pin 46. The detection mechanism readily carries out the variation of a detection position by adjusting the screw 228 and stop bolt 230, as desired, even when chip type circuit elements to be sucked up on the respective suction pins 46 are different in configuration, dimensions, and the like, from each other. In addition, the detection mechanism can save space, because it is adapted to accomplish the detection of the presence and posture of a chip type circuit element 58 sucked up on the suction pin 46 via a single photosensor. Furthermore, the detection mechanism is constructed so that the photosensor is on the mounting head, so that the positional relationships between said photosensor and the suction pin 46 may be maintained with stability, without deflection and both may be readily aligned with each other. Such construction also permits the detection operation to be carried out irrespective of the position of the mounting head and even during movement of the head.

The detection mechanism is adapted to accomplish the detection of a chip type circuit element extracted from a feed mechanism of the aforedescribed type via the suction pin, the detection of the posture of a circuit element which is being moved to the centering mechanism the detection of the presence and posture of a circuit element after the centering operation, and the detection of a circuit element immediately before mounting thereof on a printed circuit board.

As may be seen from the foregoing, the detection mechanism shown in FIGS. 19 to 25 is constructed in a manner wherein the movable support member provided with the light detecting section of the photosensor is vertically movably arranged with respect to the mounting head having a plurality of vertically movable suction pins 46. The detection mechanism detects the sucking-up of a chip type circuit element on the suction pin 46 at the raising position of the movable support member and the wrong posture of the circuit element at the lowering position of the movable support member, so that the detection of a chip type circuit element may be carried out via the single photosensor for every suction pin and the detection mechanism may be significantly simplified in structure.

The invention is by no means restricted to the aforementioned details which are described only as examples; they may vary within the framework of the invention, as defined in the following claims.

It will thus be seen that the objects set forth above, among those made apparent from the preceding description, are efficiently attained and, since certain changes may be made in the above constructions without departing from the spirit and scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

What is claimed is:

1. A mounting head for apparatus for mounting chip type circuit elements on printed circuit boards, said mounting head comprising
    a suction pin for sucking up said chip type circuit elements thereon;
    an air cylinder casing having a partition member separating said casing into a cylinder chamber and a vacuum chamber;
    a piston slidable with respect to said cylinder chamber, said piston having a lower rod portion projecting from the lower end of said casing and an upper rod portion projecting through said partition member into said vacuum chamber;
    a vacuum suction passage in said piston extending from the lower end of said lower rod portion to the upper end of said upper rod portion, said suction pin being affixed to said lower end of said lower rod portion; and
    an air filter at said upper end of said upper rod portion, said air filter closing the upper end of said vacuum suction passage.

2. A mounting head for apparatus for mounting chip type circuit elements on printed circuit boards, said mounting head comprising
    a suction pin for sucking up said chip type circuit elements thereon;
    a vertically movable vertical rod;
    a vacuum suction passage in said vertical rod and communicating with said suction pin;
    a support member for slidably supporting said vertical rod therein;
    cam means; and
    a follower member engaged with said vertical rod and actuated by said cam means
    such that actuation of said follower member by said cam means lowers said vertical rod and then raises the same.

3. The mounting head of claim 2, additionally comprising a spring for forcing said vertical rod downwardly.

4. A chip type circuit element detection device for apparatus for mounting chip type circuit elements on printed circuit boards, said apparatus including a suction pin for sucking-up said clip type circuit elements thereon, said detection device comprising
    a movable support member vertically movable with respect to a mounting head which supports said suction pin in vertically movable condition, said movable support member having a raising position and a lowering position; and
    a photosensor having a light detecting section on said movable support member, whereby the sucking-up of said chip type circuit element on said suction pin is detected at the raising position of said movable support member and the incorrect posture of said chip type circuit element sucked up on said suction pin is detected at the lowering position of said movable support member.

5. A detection device as claimed in claim 4, wherein said light detecting section of said photosensor comprises a light emitting portion and a light receiving portion at the side of the tip end of said suction pin and opposite each other.

* * * * *